(12) United States Patent
Terada et al.

(10) Patent No.: US 8,888,920 B2
(45) Date of Patent: *Nov. 18, 2014

(54) IMPRINT SYSTEM, IMPRINT METHOD, AND NON-TRANSITORY COMPUTER STORAGE MEDIUM

(75) Inventors: Shoichi Terada, Koshi (JP); Yoshio Kimura, Koshi (JP); Takahiro Kitano, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 301 days.
This patent is subject to a terminal disclaimer.

(21) Appl. No.: 13/376,876

(22) PCT Filed: Jun. 11, 2010

(86) PCT No.: PCT/JP2010/059920
§ 371 (c)(1),
(2), (4) Date: Dec. 8, 2011

(87) PCT Pub. No.: WO2010/147056
PCT Pub. Date: Dec. 23, 2010

(65) Prior Publication Data
US 2012/0073461 A1 Mar. 29, 2012

(30) Foreign Application Priority Data
Jun. 19, 2009 (JP) ................................. 2009-146186

(51) Int. Cl.
| | | |
|---|---|---|
| C23C 16/00 | (2006.01) | |
| B05C 5/00 | (2006.01) | |
| B05C 9/08 | (2006.01) | |
| B05C 1/06 | (2006.01) | |
| B05B 13/02 | (2006.01) | |
| H01L 21/677 | (2006.01) | |
| B28B 7/38 | (2006.01) | |
| B29C 33/58 | (2006.01) | |
| B08B 3/02 | (2006.01) | |
| G03F 7/00 | (2006.01) | |
| B82Y 10/00 | (2011.01) | |
| H01L 21/67 | (2006.01) | |
| B82Y 40/00 | (2011.01) | |
| B05C 13/00 | (2006.01) | |
| B05D 3/12 | (2006.01) | |

(52) U.S. Cl.
CPC .............. *G03F 7/0002* (2013.01); *B29C 33/58* (2013.01); *B08B 3/024* (2013.01); *B82Y 10/00* (2013.01); *H01L 21/67225* (2013.01); *B82Y 40/00* (2013.01); *B05C 13/00* (2013.01); *Y10S 414/141* (2013.01)

USPC ............ 118/731; 118/46; 118/206; 118/209; 118/256; 118/305; 118/323; 118/620; 118/719; 118/722; 414/217; 414/941; 101/483; 425/90; 425/174.4; 156/345.32; 156/384; 396/611; 427/133; 427/154; 427/314

(58) Field of Classification Search
CPC . G03F 7/0002; B82Y 40/00; H01L 21/67276; H01L 21/67742; H01L 21/6715; H01L 21/566; H01L 21/67739; H01L 21/67057; B05C 9/14; B05C 13/00
USPC ............ 118/72, 719, 46, 206, 209, 256, 305, 118/323, 620, 722; 156/389, 345.22, 156/345.31; 264/40.1, 272.17; 134/1, 1.3, 134/26, 30; 414/217, 939, 935; 425/174.4
See application file for complete search history.

(56) References Cited

U.S. PATENT DOCUMENTS 5,772,905 A * 6/1998 Chou .............................. 216/44
5,788,868 A * 8/1998 Itaba et al. ...................... 216/41
(Continued)

FOREIGN PATENT DOCUMENTS

| JP | A-2005-153091 | 6/2005 |
| JP | A-2009-043998 | 2/2009 |

(Continued)

OTHER PUBLICATIONS

International Search Report mailed Aug. 31, 2010 in corresponding International Application No. PCT/JP2010/059920 (English copy enclosed).

*Primary Examiner* — Dah-Wei D Yuan
*Assistant Examiner* — Karl Kurple
(74) *Attorney, Agent, or Firm* — Posz Law Group, PLC

(57) ABSTRACT

The present invention is an imprint system including an imprint unit transferring a transfer pattern to a coating film formed on a substrate using a template having the transfer pattern formed on a front surface thereof to form a predetermined pattern in the coating film, the imprint system including: a substrate carry-in/out station connected to the imprint unit, capable of keeping a plurality of the substrates, and carrying the substrate into/out of the imprint unit side; and a template carry-in/out station connected to the imprint unit, capable of keeping a plurality of the templates, and carrying the template into/out of the imprint unit side at a predetermined timing.

12 Claims, 29 Drawing Sheets

(56) References Cited

U.S. PATENT DOCUMENTS

| | | | |
|---|---|---|---|
| 5,934,856 A * | 8/1999 | Asakawa et al. | 414/217 |
| 6,805,054 B1 * | 10/2004 | Meissl et al. | 101/483 |
| 6,926,057 B2 * | 8/2005 | Ueyama et al. | 156/540 |
| 6,972,844 B2 * | 12/2005 | Tokita | 356/401 |
| 7,832,416 B2 * | 11/2010 | Wang et al. | 134/61 |
| 8,227,267 B2 * | 7/2012 | Yoneda et al. | 438/16 |
| 8,468,943 B2 * | 6/2013 | Hiroshiro et al. | 101/483 |
| 8,470,188 B2 * | 6/2013 | Menezes | 216/39 |
| 8,603,380 B2 * | 12/2013 | Ishii et al. | 264/293 |
| 2004/0065976 A1 * | 4/2004 | Sreenivasan et al. | 264/171.1 |
| 2005/0116370 A1 * | 6/2005 | Ogino et al. | 264/40.1 |
| 2006/0292845 A1 * | 12/2006 | Chiang et al. | 438/597 |
| 2007/0248892 A1 * | 10/2007 | Rangelow | 430/5 |
| 2007/0267764 A1 * | 11/2007 | Morimoto | 264/1.1 |
| 2008/0145773 A1 * | 6/2008 | Wang et al. | 430/22 |
| 2009/0311434 A1 * | 12/2009 | Inamasu et al. | 427/424 |
| 2010/0085555 A1 * | 4/2010 | Schmid et al. | 355/76 |
| 2010/0143521 A1 * | 6/2010 | Choi et al. | 425/150 |
| 2011/0117291 A1 * | 5/2011 | Hiroshiro et al. | 427/553 |
| 2011/0127156 A1 * | 6/2011 | Foad et al. | 204/192.12 |
| 2011/0163451 A1 * | 7/2011 | Matsumoto et al. | 257/751 |
| 2011/0219635 A1 * | 9/2011 | Rangelow | 33/645 |
| 2011/0284499 A1 * | 11/2011 | Suehira et al. | 216/41 |
| 2012/0006703 A1 * | 1/2012 | Khusnatdinov et al. | 206/223 |
| 2012/0072003 A1 * | 3/2012 | Matsuoka et al. | 700/110 |
| 2012/0086142 A1 * | 4/2012 | Terada et al. | 264/39 |
| 2012/0097336 A1 * | 4/2012 | Terada et al. | 156/389 |
| 2012/0200006 A1 * | 8/2012 | Minoda | 264/293 |
| 2012/0299147 A1 * | 11/2012 | Mitani | 257/506 |
| 2013/0233829 A1 * | 9/2013 | Kobayashi et al. | 216/83 |

FOREIGN PATENT DOCUMENTS

| | | |
|---|---|---|
| JP | A-2009-214323 | 9/2009 |
| JP | A-2010-040879 | 2/2010 |
| JP | A-2010-056286 | 3/2010 |

* cited by examiner (a)

(b)

(c)

(d)

→ Y (a)

(b)

(c)

(d)

(a)

(b)

(c)

IMPRINT SYSTEM, IMPRINT METHOD, AND NON-TRANSITORY COMPUTER STORAGE MEDIUM

TECHNICAL FIELD

The present invention relates to an imprint system including an imprint unit transferring a transfer pattern to a coating film formed on a substrate using a template having the transfer pattern formed on a front surface thereof to form a predetermined pattern in the coating film, an imprint method using the imprint system, and a non-transitory computer storage medium.

BACKGROUND ART

In a manufacturing process of a semiconductor device, for example, photolithography processing is performed, for example, on a semiconductor wafer (hereinafter, referred to as a "wafer") to form a predetermined resist pattern on the wafer.

When forming the above-described resist pattern, miniaturization of the resist pattern is required in order for higher integration of the semiconductor device. Generally, the limit of miniaturization in the photolithography processing is about the wavelength of light used in exposure processing. Therefore, conventionally, the wavelength of light for use in the exposure processing has been increasingly reduced. However, there are technical and cost limits in reducing the wavelength of an exposure light source, and it is now difficult to form a fine resist pattern at a level of, for example, several nanometers only by the method of increasingly reducing the wavelength of light.

Hence, recently, it is proposed to form a fine resist pattern on the wafer using a so-called imprint method instead of performing photolithography processing on the wafer. This method is to bring a template (referred also to as a mold or a die) having a fine pattern on its front surface into press contact with the resist surface formed on the wafer and then peel off the template to thereby directly transfer the pattern to the resist surface (Patent Document 1).

PRIOR ART DOCUMENT

Patent Document

[Patent Document 1] Japanese Laid-open Patent Publication No. 2009-43998

DISCLOSURE OF THE INVENTION

Problems to be Solved by the Invention

Incidentally, when the above-described imprint method is repeatedly performed, namely, when resist patterns are formed on a plurality of wafers using one template, the transfer of pattern cannot be correctly performed any longer from a certain point in time. This is caused from deterioration of a release agent, having liquid repellency to a resist, whose film is typically formed on the front surface of the template. Therefore, it is necessary to periodically replace the template.

Further, when different resist patterns are formed on a plurality of wafers, the template needs to be replaced for each resist pattern.

However, efficient replacement of the template has not been considered at all in the conventional imprint method. Therefore, for example, when a defect such as deterioration or the like occurs in the template, defective resist patterns will be successively formed on wafers. Further, for example, when different resist patterns are formed on a plurality of wafers, the templates corresponding to the different resist patterns could not be efficiently replaced in the conventional imprint method. Accordingly, it has been actually difficult to successively form predetermined resist patterns on a plurality of wafers, thus failing to cope with mass production of semiconductor devices.

The present invention has been made in consideration of the above points, and it is an object to efficiently replace a template and successively form predetermined patterns on a plurality of substrates.

Means for Solving the Problems

To achieve the above object, the present invention is an imprint system including an imprint unit transferring a transfer pattern to a coating film formed on a substrate using a template having the transfer pattern formed on a front surface thereof to form a predetermined pattern in the coating film, the imprint system including: a substrate carry-in/out station connected to the imprint unit, capable of keeping a plurality of the substrates, and carrying the substrate into/out of the imprint unit side; and a template carry-in/out station connected to the imprint unit, capable of keeping a plurality of the templates, and carrying the template into/out of the imprint unit side at a predetermined timing. Note that the predetermined timing to carry the template in/out is set in consideration, for example, of the deterioration of the template. Further, also when a different pattern is formed on a substrate, a template is carried in/out.

Since the imprint system of the present invention has the substrate carry-in/out station and the template carry-in/out station, it is possible to form predetermined patterns on a predetermined number of substrates using one of the templates in the imprint unit and then successively replace the one template with other templates. This ensures that before the template deteriorates or even when different patterns are formed on a plurality of substrates, the template in the imprint unit is successively and efficiently replaced. Accordingly, predetermined patterns can be successively formed on a plurality of substrates.

The present invention according to another aspect is an imprint method using an imprint system, the imprint system including: an imprint unit transferring a transfer pattern to a coating film formed on a substrate using a template having the transfer pattern formed on a front surface thereof to form a predetermined pattern in the coating film; a substrate carry-in/out station connected to the imprint unit, capable of keeping a plurality of the substrates, and carrying the substrate into/out of the imprint unit side; and a template carry-in/out station connected to the imprint unit, capable of keeping a plurality of the templates, and carrying the template into/out of the imprint unit side, the imprint method including the steps of: forming predetermined patterns on a predetermined number of substrates using one of the templates in the imprint unit; and then carrying the one template out of the imprint unit, and carrying another of the templates into the imprint unit and replacing the template in the imprint unit.

According to the present invention in still another aspect, a non-transitory computer-readable storage medium storing a program running on a computer of a control unit controlling an imprint system to cause the imprint system to execute the above-described imprint method is provided.

Effect of the Invention

According to the present invention, it is possible to efficiently replace a template and successively form predetermined patterns on a plurality of substrates.

BEST MODE FOR CARRYING OUT THE INVENTION

Figure 1:
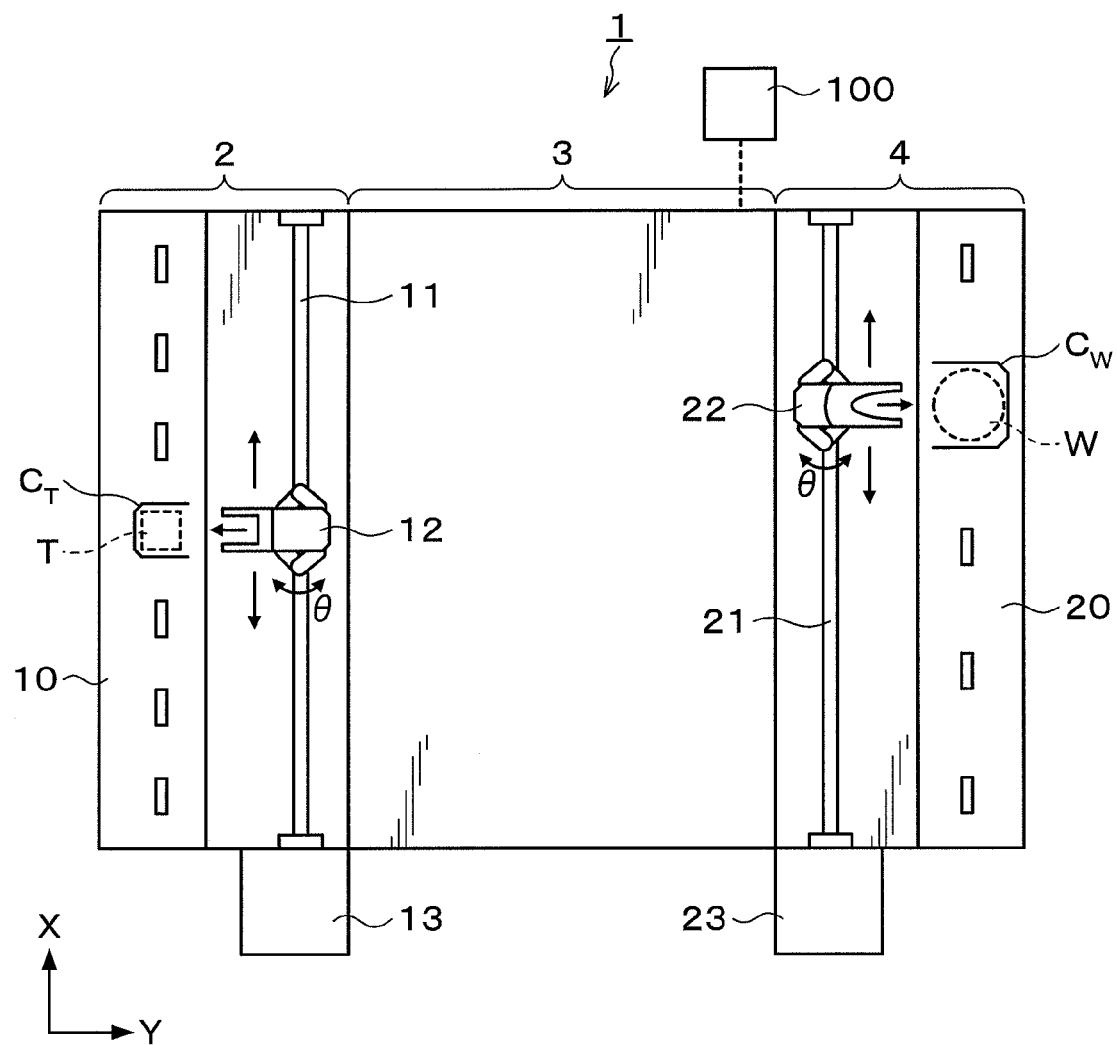
FIG. 1 A plan view illustrating the outline of the configuration of an imprint system according to this embodiment.
Figure 2:
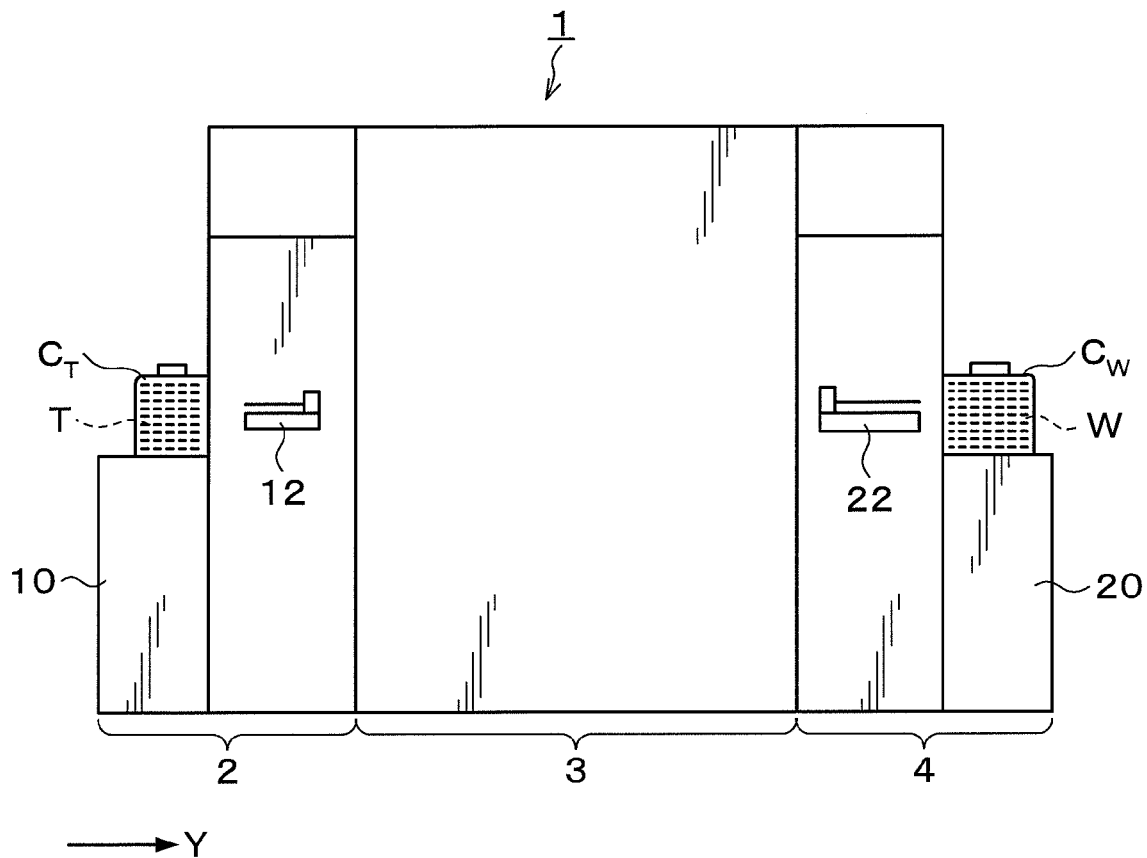
FIG. 2 A side view illustrating the outline of the configuration of the imprint system according to this embodiment.

Hereinafter, an embodiment of the present invention will be described. FIG. 1 is a plan view illustrating the outline of the configuration of an imprint system 1 according to this embodiment. FIG. 2 is a side view illustrating the outline of the configuration of the imprint system 1.

Figure 3:
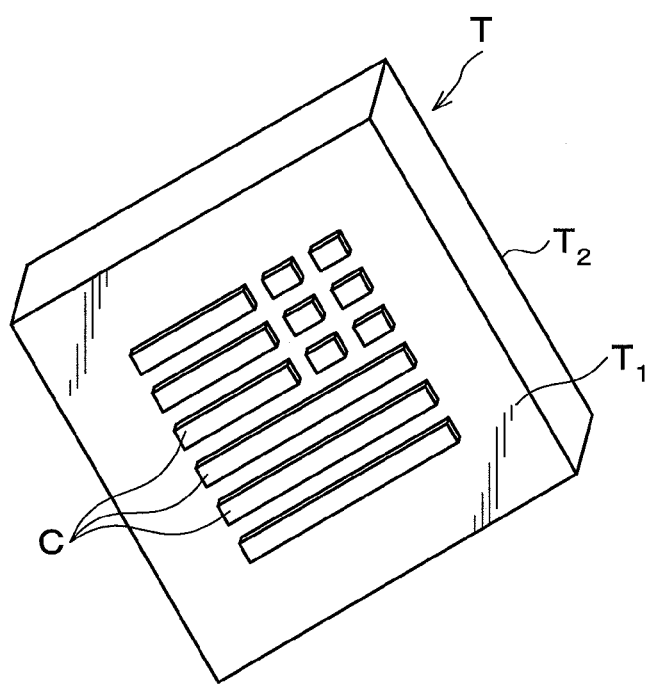
FIG. 3 A perspective view of a template.
Figure 4:
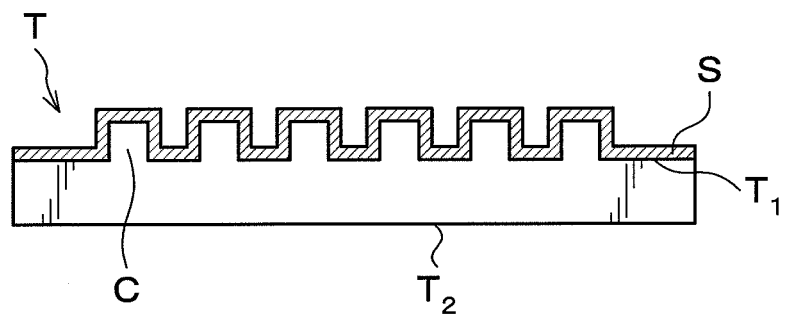
FIG. 4 A side view of the template.

In the imprint system 1 of this embodiment, a template T which has a rectangular parallelepiped shape and a predetermined transfer pattern C formed on its front surface as illustrated in FIG. 3 is used. Hereinafter, the surface of the template T on which the transfer pattern C is formed is referred to as a front surface $T_1$ and the surface opposite the front surface $T_1$ is referred to as a rear surface $T_2$. A film of a release agent S along the shape of the transfer pattern C is formed as illustrated in FIG. 4 on the front surface $T_1$ of the template T. Note that for the template T, a transparent material which can transmit light such as visible light, near ultraviolet light, ultraviolet light, for example, glass is used. Note that as the material of the release agent S, a material having liquid repellency to a later-described resist film on a wafer, for example, a fluorocarbon resin or the like is used.

The imprint system 1 has, as illustrated in FIG. 1, the configuration in which a template carry-in/out station 2 for carrying a plurality of, for example, 5 templates T per cassette as a unit from/to the outside into/from the imprint system 1 and carrying the templates T into/out of a template cassette $C_T$, an imprint unit 3 for forming a resist pattern on a wafer W as a substrate using the template T, and a wafer carry-in/out station 4 for carrying a plurality of, for example, 25 wafers W per cassette as a unit from/to the outside into/from the imprint system 1 and carrying the wafers W into/out of a wafer cassette $C_W$, are integrally connected.

In the template carry-in/out station 2, a cassette mounting table 10 is provided. The cassette mounting table 10 is configured such that a plurality of template cassettes $C_T$ can be mounted thereon in a line in an X-direction (a top and bottom direction in FIG. 1). In other words, the template carry-in/out station 2 is configured to be capable of keeping a plurality of templates T therein.

In the template carry-in/out station 2, a template carrying body 12 is provided which is movable on a carry path 11 extending in the X-direction. The template carrying body 12 is also movable in a vertical direction and around the vertical (in a θ-direction), and thus can carry the template T between the template cassette $C_T$ and the imprint unit 3.

In the template carry-in/out station 2, a reversing unit 13 reversing the front and rear surfaces of the template T is further provided.

In the wafer carry-in/out station 4, a cassette mounting table 20 is provided. The cassette mounting table 20 is configured such that a plurality of wafer cassettes $C_W$ can be mounted thereon in a line in the X-direction (the top and bottom direction in FIG. 1). In other words, the wafer carry-in/out station 4 is configured to be capable of keeping a plurality of wafers W therein.

In the wafer carry-in/out station 4, a wafer carrying body 22 is provided which is movable on a carry path 21 extending in the X-direction. The wafer carrying body 22 is also movable in the vertical direction and around the vertical (in the θ-direction), and thus can carry the wafer W between the wafer cassette $C_W$ and the imprint unit 3.

In the wafer carry-in/out station 4, an alignment unit 23 adjusting the orientation of the wafer W is further provided. In the alignment unit 23, the orientation of the wafer W is adjusted based on, for example, the position of a notch portion of the wafer W.

Figure 5:
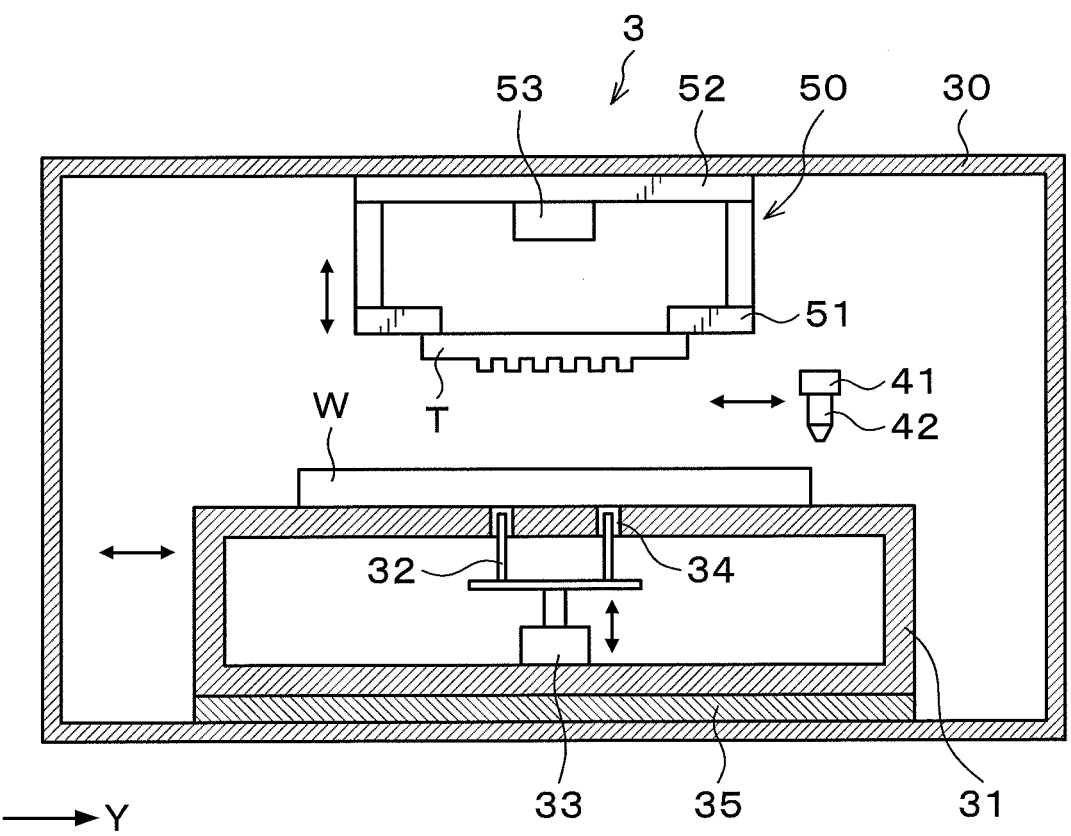
FIG. 5 A longitudinal sectional view illustrating the outline of the configuration of an imprint unit.

Next, the configuration of the aforementioned imprint unit 3 will be described. The imprint unit 3 has a casing 30 having a carry-in/out port (not illustrated) for the template T and a carry-in/out port (not illustrated) for the wafer W which are formed in its side surfaces as illustrated in FIG. 5.

On the bottom surface in the casing 30, a wafer holding part 31 as a substrate holding part on which the wafer W is mounted and held is provided. The wafer W is mounted on the upper surface of the wafer holding part 31 such that its surface to be processed faces upward. Inside the wafer holding part 31, raising and lowering pins 32 for supporting the wafer W from below and raising and lowering the wafer W are provided. The raising and lowering pins 32 can move up and down by means of a raising and lowering drive part 33. On the upper surface of the wafer holding part 31, through holes 34 penetrating the upper surface in the thickness direction are formed so that the raising and lowering pins 32 are inserted into the through holes 34. Further, the wafer holding part 31 is movable in the horizontal direction and rotatable around the vertical by means of a moving mechanism 35 provided below the wafer holding part 31.

Figure 6:
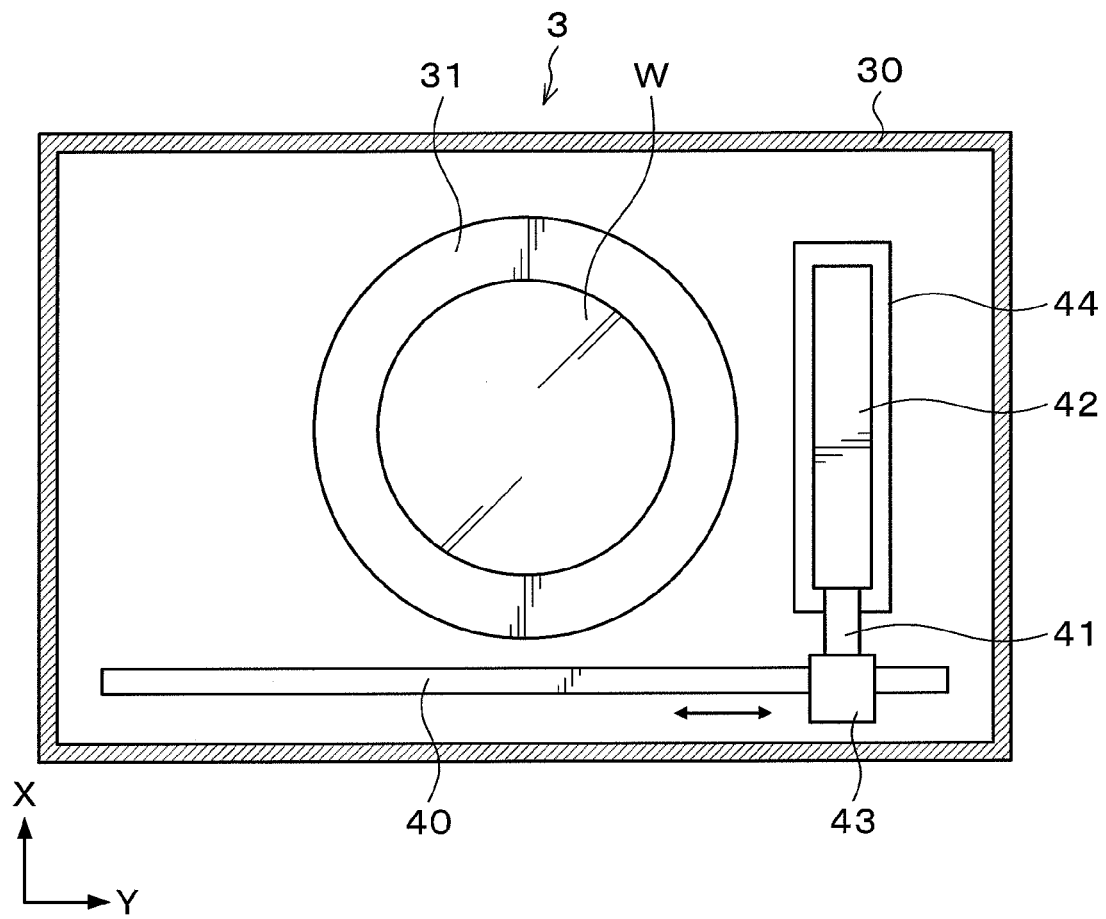
FIG. 6 A transverse sectional view illustrating the outline of the configuration of the imprint unit.

As illustrated in FIG. 6, on an X-direction negative direction (a downward direction in FIG. 6) side of the wafer holding part 31, a rail 40 extending along a Y-direction (a right and left direction in FIG. 6) is formed. The rail 40 is formed, for example, from a Y-direction negative direction (a left direction in FIG. 6) side outer position of the wafer holding part 31 to a Y-direction positive direction (a right direction in FIG. 6) side outer position. On the rail 40, for example, an arm 41 is attached.

On the arm 41, a resist solution nozzle 42 as a coating solution supply part supplying the resist solution as a coating solution onto the wafer W is supported. The resist solution nozzle 42 has an elongated shape along the X-direction having the size, for example, equal to or longer than the dimension of the diameter of the wafer W. For the resist solution nozzle 42, for example, an ink-jet type nozzle is used, and a plurality of supply ports (not illustrated) formed in a line along the longitudinal direction are formed at a lower portion of the resist solution nozzle 42. The supply timing of the resist solution, the supply amount of the resist solution and so on of the resist solution nozzle 42 can be precisely controlled.

The arm 41 is movable on the rail 40 by means of a nozzle drive part 43. Thus, the resist solution nozzle 42 can move from a waiting section 44 provided at a Y-direction positive direction side outer position of the wafer holding part 31 to a position above the wafer W on the wafer holding part 31 and further move in the radial direction of the wafer W above the front surface of the wafer W. Further, the arm 41 is movable up and down by means of the nozzle drive part 43 to be able to adjust the height of the resist solution nozzle 42.

On the ceiling surface in the casing 30 and above the wafer holding part 31, a template holding part 50 holding the template T is provided as illustrated in FIG. 5. More specifically, the wafer holding part 31 and the template holding part 50 are arranged such that the wafer W mounted on the wafer holding part 31 faces the template T held by the template holding part 50. Further, the template holding part 50 has a chuck 51 suction-holding the outer peripheral portion of the rear surface $T_2$ of the template T. The chuck 51 is movable in the vertical direction and rotatable around the vertical by means of a moving mechanism 52 provided above the chuck 51. Thus, the template T can rotate and move up and down in a predetermined orientation with respect to the wafer W on the wafer holding part 31.

The template holding part 50 has a light source 53 provided above the template T held by the chuck 51. From the light source 53, light such as visible light, near ultraviolet light, ultraviolet light is emitted, and the light from the light source 53 is transmitted through the template T and applied downward.

Figure 7:
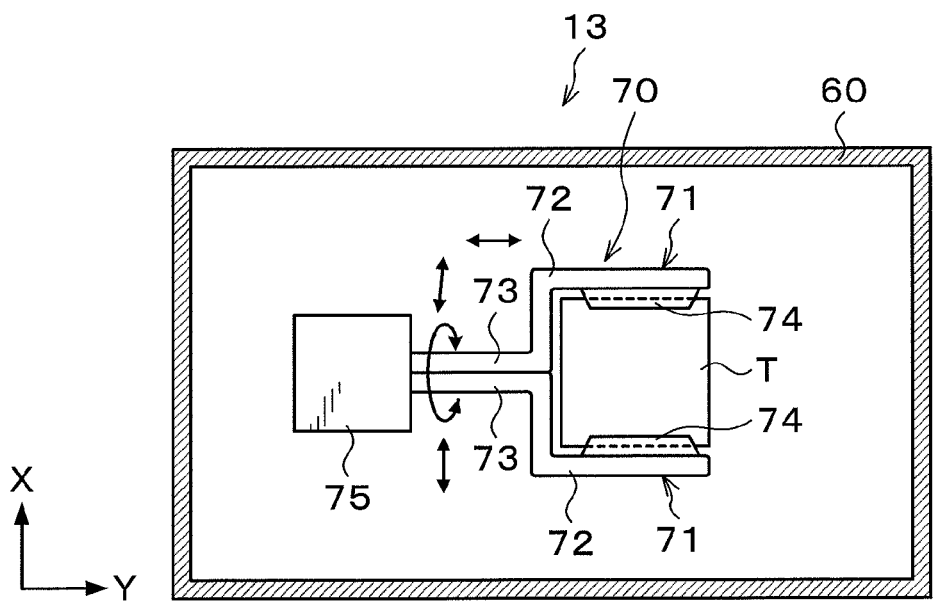
FIG. 7 A transverse sectional view illustrating the outline of the configuration of a reversing unit.

Next, the configuration of the aforementioned reversing unit 13 will be described. The reversing unit 13 has a casing 60 having a carry-in/out port (not illustrated) for the template T which is formed in its side surface as illustrated in FIG. 7.

Figure 8:
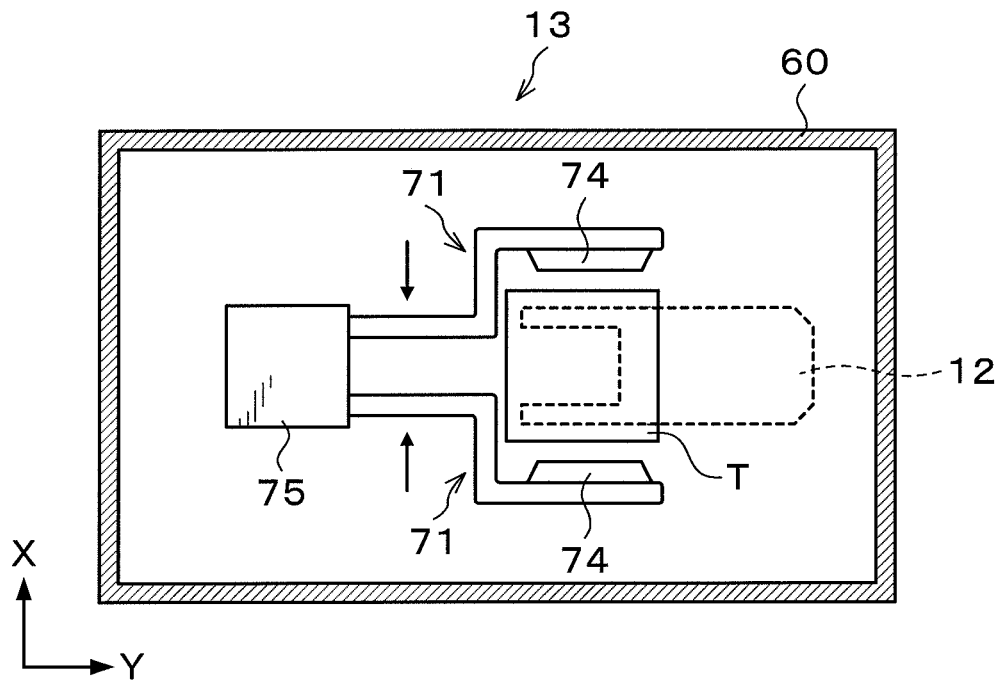
FIG. 8 An explanatory view illustrating the appearance that a reversing mechanism holds the template.

In the casing 60, a reversing mechanism 70 reversing the front and rear surfaces of the template T is provided. The reversing mechanism 70 has a pair of holding parts 71, 71 capable of moving close to or away from each other. The holding part 71 has a frame part 72 configured to conform to the outer shape of the temperate T and an arm part 73 supporting the frame part 72, and the frame part 72 and the arm part 73 are integrally formed. The frame part 72 is provided with a fastening part 74 for holding the template T, and a tapered groove (not illustrated) is formed at the fastening part 74. The pair of separated holding parts 71, 71 move close to each other as illustrated in FIG. 8, whereby the outer peripheral portion of the template T is inserted in the tapered grooves of the fastening parts 74 and the template T is thereby supported.

Figure 9:
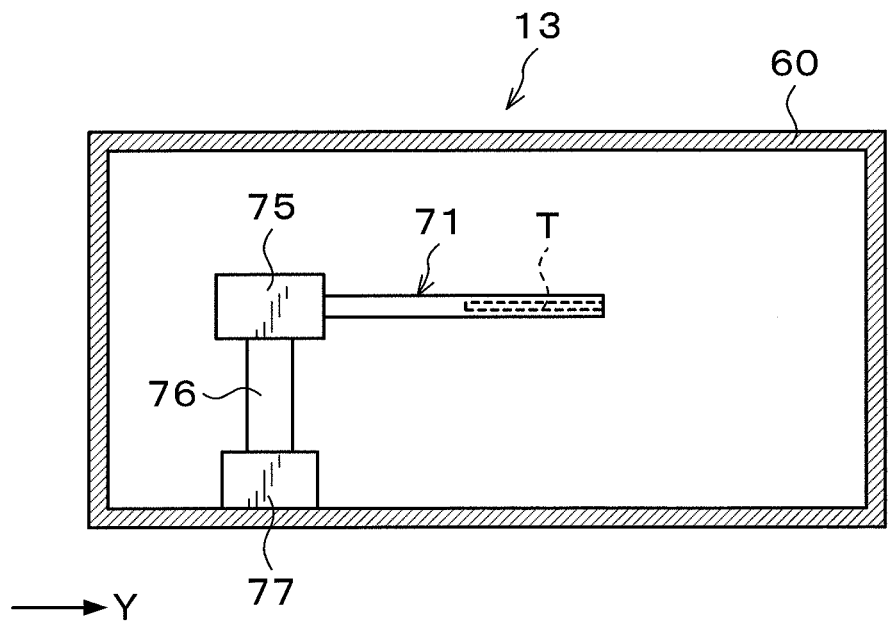
FIG. 9 A longitudinal sectional view illustrating the outline of the configuration of the reversing unit.

The holding parts 71 are supported by a rotation drive part 75 as illustrated in FIG. 9. By means of the rotation drive part 75, the holding parts 71 can rotate around the horizontal direction (around a Y-axis) and expand and contact in the horizontal direction (in the Y-direction). In short, the front and rear surfaces of the template T held by the holding parts 71 are reversed. Below the rotation drive part 75, a raising and lowering part 77 is provided via a shaft 76. By means of the raising and lowering part 77, the rotation drive part 75 and the holding parts 71 can move up and down.

In the above imprint system 1, a control unit 100 is provided as illustrated in FIG. 1. The control unit 100 is, for example, a computer and has a program storage unit (not illustrated). In the program storage unit, a program is stored which controls the carry of the template T between the template carry-in/out station 2 and the imprint unit 3, the carry of the wafer W between the wafer carry-in/out station 4 and the imprint unit 3, the operation of the drive system in the imprint unit 3 and so on to thereby execute the later-described imprint processing in the imprint system 1. Note that this program may be the one that is stored, for example, in a computer-readable storage medium such as a computer-readable hard disk (HD), flexible disk (FD), compact disk (CD), magneto-optical disk (MO), or memory card, and installed from the storage medium into the control unit 100.

Figure 10:
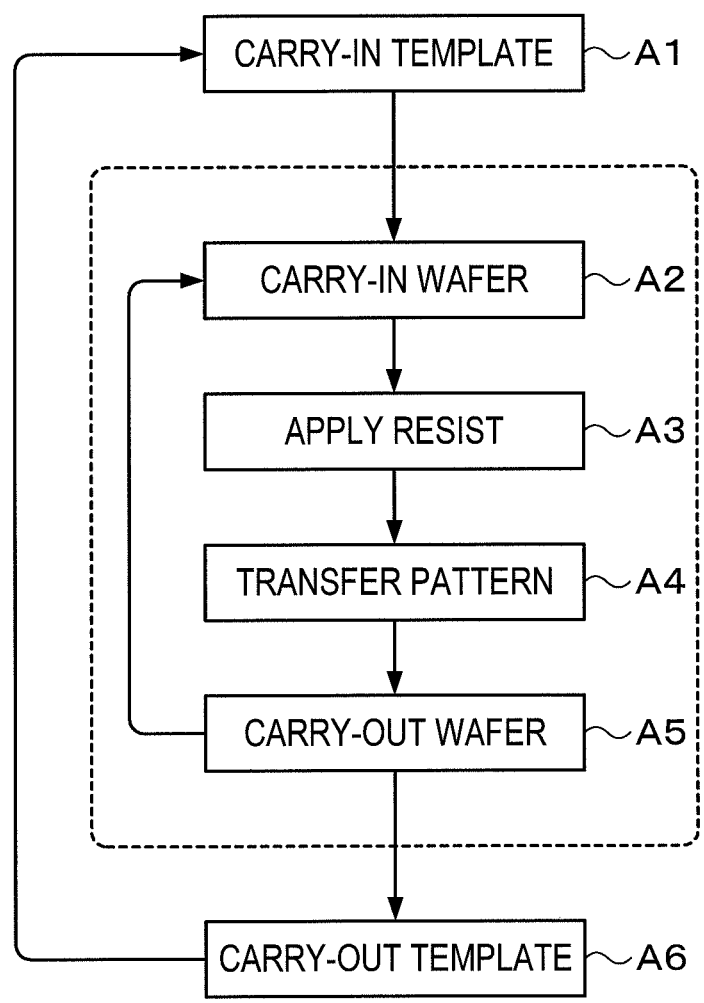
FIG. 10 A flowchart illustrating steps of imprint processing.
Figure 11:
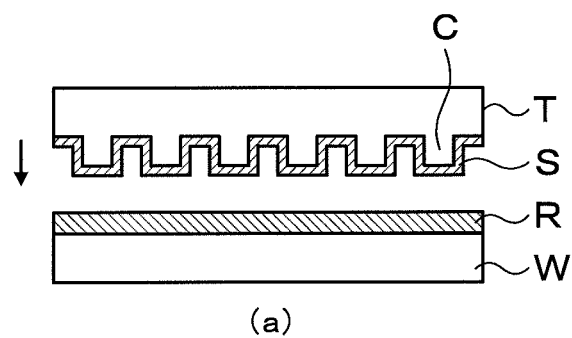
FIG. 11 An explanatory view schematically illustrating the states of a template and a wafer in respective steps of the imprint processing, (a) of FIG. 11 illustrating the appearance that a resist solution is applied on the wafer, (b) of FIG. 11 illustrating the appearance that photo polymerization of the resist film on the wafer takes place, (c) of FIG. 11 illustrating the appearance that a resist pattern is formed on the wafer, and (d) of FIG. 11 illustrating the appearance that a residual film on the wafer is removed.
Figure 11:
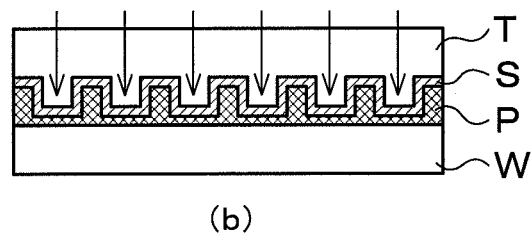
Figure 11:
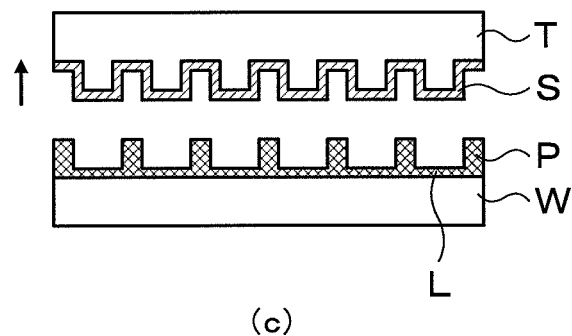
Figure 11:
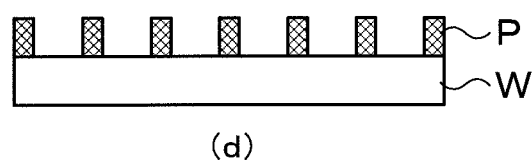

The imprint system 1 according to this embodiment is configured as described above. Next, the imprint processing performed in the imprint system 1 will be described. FIG. 10 illustrates a main processing flow of the imprint processing, and FIG. 11 illustrates the states of the template T and the wafer W in respective steps.

First of all, a template T is taken by the template carrying body 12 out of the template cassette $C_T$ on the cassette mounting table 10 and carried to the reversing unit 13. In this event, the template T is housed in the template cassette $C_T$ such that its front surface $T_1$ having the transfer pattern C formed thereon faces upward, so that the template T in this state is carried to the reversing unit 13.

The template T carried into the reversing unit 13 is delivered to the reversing mechanism 70 and its front and rear surfaces are reversed. In other words, the rear surface $T_2$ of the template T is oriented upward. Thereafter, the template T is carried by the template carrying body 12 to the imprint unit 3 (Step A1 in FIG. 10). The template T carried into the imprint unit 3 is suction-held by the chuck 51 of the template holding part 50.

During carry of the template T from the template carry-in/out station 2 to the imprint unit 3 in this manner, the wafer W is taken by the wafer carrying body 22 out of the wafer cassette $C_W$ on the cassette mounting table 20 and carried to the alignment unit 23 in the wafer carry-in/out station 4. Then, in the alignment unit 23, the orientation of the wafer W is adjusted based on the position of the notch portion of the wafer W. Thereafter, the wafer W is carried by the wafer carrying body 22 to the imprint unit 3 (Step A2 in FIG. 10). Note that in the wafer carry-in/out station 4, the wafer W in the wafer cassette $C_W$ is housed such that its surface to be processed faces upward, so that the wafer W in this state is carried to the imprint unit 3.

The wafer W carried into the imprint unit 3 is passed to the raising and lowering pins 32 and mounted and held on the wafer holding part 31. Subsequently, the wafer W held on the wafer holding part 31 is moved to a predetermined position in the horizontal direction to be aligned, and thereafter the resist solution nozzle 42 is moved in the radial direction of the wafer W and applies the resist solution onto the wafer W as illustrated in FIG. 11(a), whereby a resist film R as a coating film is formed (Step A3 in FIG. 10). In this event, the control unit 100 controls the supply timing, the supply amount and so on of the resist solution supplied from the resist solution nozzle 42. More specifically, the resist solution is applied such that the amount of the resist solution to be applied to a portion corresponding to a protruding portion in the resist pattern to be formed on the wafer W (a portion corresponding to a recessed portion in the transfer pattern C of the template T) is large, while the amount of the resist solution to be applied to a portion corresponding to a recessed portion in the resist pattern (a portion corresponding to a protruding portion in the transfer pattern C) is small. The resist solution is applied onto the wafer W according to the aperture ratio of the transfer pattern C in this manner.

Upon formation of the resist film R on the wafer W, the wafer W held on the wafer holding part 31 is moved to a predetermined position in the horizontal direction to be aligned, and the template T held by the template holding part 50 is rotated in a predetermined orientation. The template T is then moved down toward the wafer W as illustrated by an arrow in FIG. 11(a). The template T is moved down to a predetermined position, and the front surface $T_1$ of the template T is pressed against the resist film R on the wafer W. Note that the predetermined position is set based on the height of the resist pattern to be formed on the wafer W. Subsequently, light is applied from the light source 53. The light from the light source 53 is transmitted through the template T and applied to the resist film R on the wafer W as illustrated in FIG. 11(b), whereby photo polymerization of the resist film R takes place. In this manner, the transfer pattern C of the template T is transferred to the resist film R on the wafer W, whereby a resist pattern P is formed (Step A4 in FIG. 10).

Thereafter, the template T is moved up as illustrated in FIG. 11(c), whereby the resist pattern P is formed on the wafer W. In this event, since the release agent S has been applied on the front surface $T_1$ of the template T, the resist on the wafer W never adheres to the front surface $T_1$ of the template T. Thereafter, the wafer W is passed to the wafer carrying body 22 by the raising and lowering pins 32, and carried from the imprint unit 3 to the wafer carry-in/out station 4 and returned to the wafer cassette $C_W$ (Step A5 in FIG. 10). Note that a thin residual film L of resist can remain in the recessed portion of the resist pattern P formed on the wafer W, and the residual film L may be removed as illustrated in FIG. 11(d), for example, outside the imprint system 1.

By repeatedly performing the above-described Steps A2 to A5 (a part surrounded by a dotted line in FIG. 10), resist patterns P are formed respectively on a plurality of wafers W using one template T. After such processing is performed on a predetermined number of wafers W, the template T is replaced. More specifically, the template T in the imprint unit 3 is passed to the template carrying body 12 and carried from the imprint unit 3 to the template carry-in/out station 2 (Step A6 in FIG. 10). Thereafter, the template T is carried to the reversing unit 13 and the front and rear surfaces of the template T are reversed, namely, the front surface $T_1$ of the template T is oriented upward, and then the template T is returned to the template cassette $C_T$. Subsequently, a next template T is carried from the template carry-in/out station 2 to the imprint unit 3. Note that the timing to replace the template T is set in consideration of the deterioration and the like of the template T. Further, also when a different pattern P is formed on the wafer W, the template T is replaced. The template T may be replaced, for example, every time the template T is used once. Alternatively, the template T may be replaced for every wafer W, or the template T may be replaced for every lot.

In this manner, predetermined resist patterns P can be successively formed on a plurality of wafers W in the imprint system 1.

The imprint system 1 in the above embodiment has the template carry-in/out station 2 and the wafer carry-in/out station 4, so that after resist patterns P are formed on a predetermined number of wafers W using one template T, the one template T can be successively replaced with other templates T. Thus, for example, before the template T deteriorates or even when different resist patterns P are formed on a plurality of wafers W, the template T in the imprint unit 3 can be successively and efficiently replaced. Accordingly, predetermined resist patterns P can be successively formed on a plurality of wafers W. This also enables realization of mass production of semiconductor devices.

Further, since the reversing unit 13 reversing the front and rear surfaces of the template T is provided in the template carry-in/out station 2, the template can be smoothly carried between the template cassette $C_T$ in the template carry-in/out station 2 and the imprint unit 3. Further, since the template T is smaller than the wafer W, the front and rear surfaces of the template T can be easily reversed.

Figure 12:
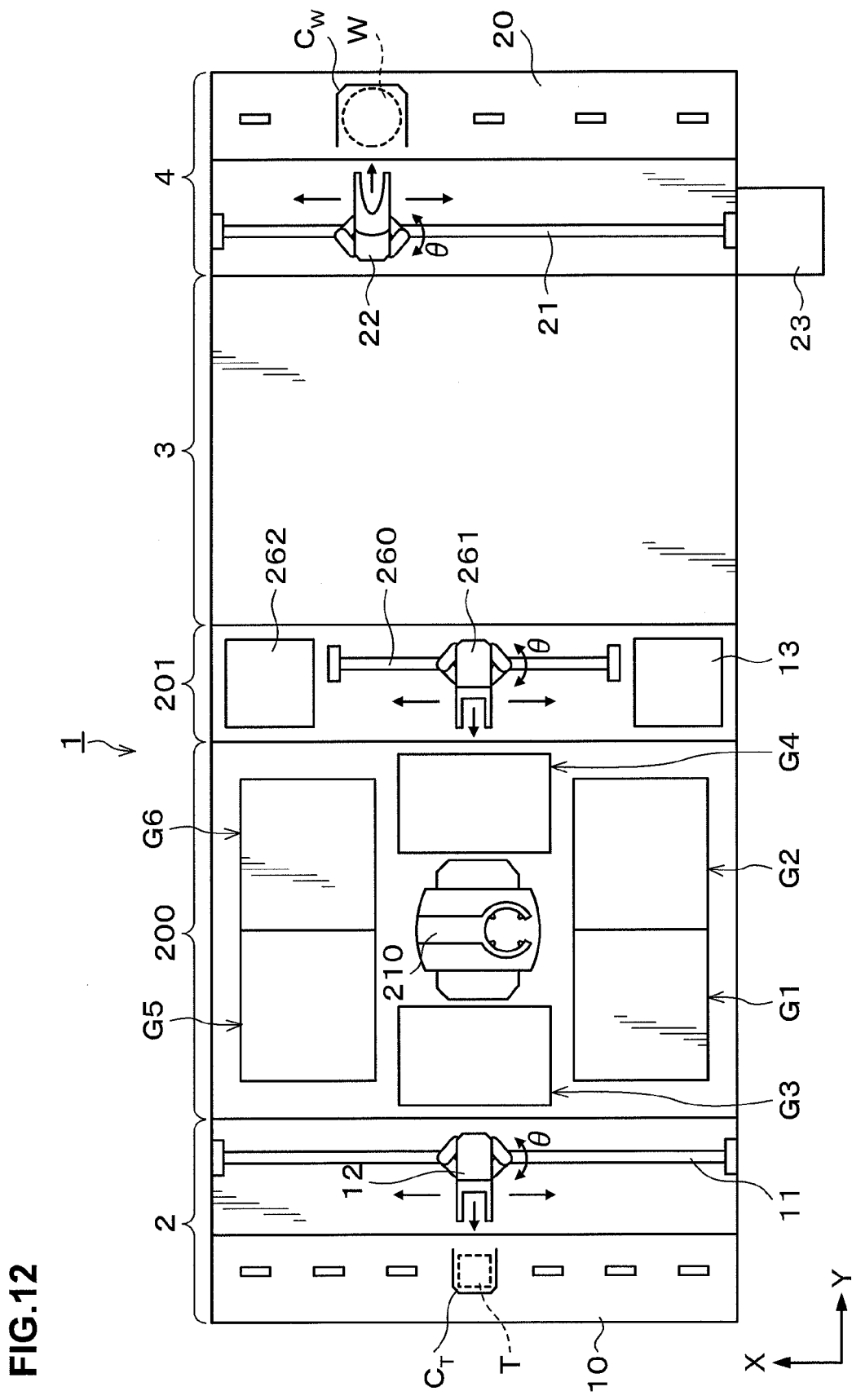
FIG. 12 A plan view illustrating the outline of the configuration of an imprint system according to another embodiment.

In the imprint system 1 of the above embodiment, a treatment station 200 including a plurality of treatment units performing predetermined treatments on the template T and an interface station 201 provided adjacent to the treatment station 200 and passing the template T between the treatment station 200 and the imprint unit 3 may be arranged between the template carry-in/out station 2 and the imprint unit 3 as illustrated in FIG. 12.

At a central portion in the treatment station 200, a carry unit 210 is provided. Around the carry unit 210, for example, six treatment blocks G1 to G6 are arranged in each of which a plurality of treatment units are multi-tiered. On the front side in the treatment station 200 (an X-direction negative direction side in FIG. 12), the first treatment block G1 and the second treatment block G2 are placed in order from the template carry-in/out station 2 side. The third treatment block G3 is placed on the template carry-in/out station 2 side in the treatment station 200, and the fourth treatment block G4 is placed on the imprint unit 3 side in the treatment station 200. On the rear side in the treatment station 200 (an X-direction positive direction side in FIG. 12), the fifth treatment block G5 and the sixth treatment block G6 are placed in order from the template carry-in/out station 2 side. The carry unit 210 can carry the template T to the later-described various kinds of treatment units arranged in the treatment blocks G1 to G6. Note that the treatment blocks G1 to G4 constitute a release agent treatment block, and the treatment blocks G5, G6 constitute a template cleaning block in this embodiment.

Figure 13:
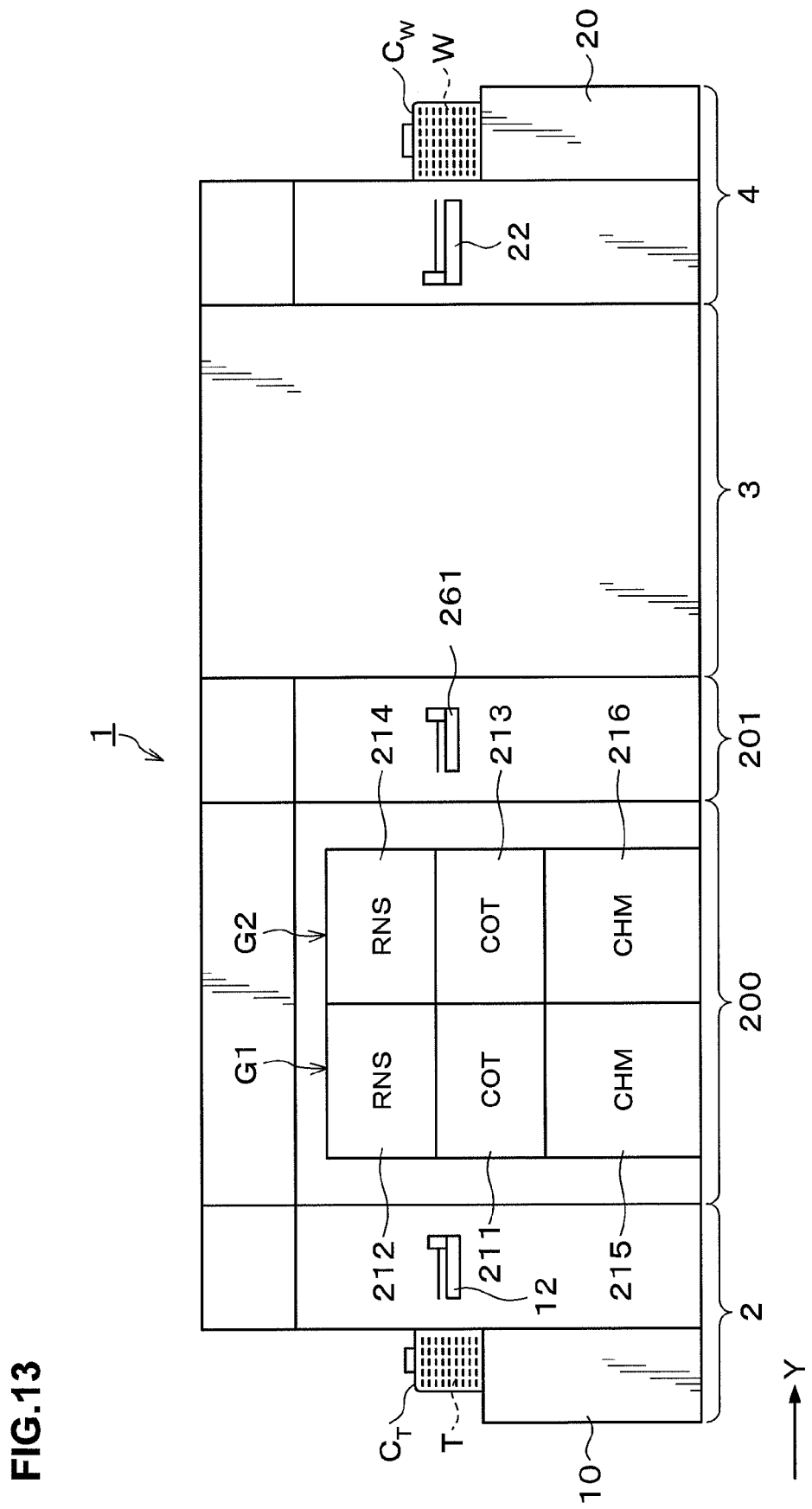
FIG. 13 A side view illustrating the outline of the configuration of the imprint system according to another embodiment.

In the first treatment block G1, as illustrated in FIG. 13, a plurality of solution treatment units, for example, a release agent coating unit 211 applying a liquid release agent S to the template T and a rinse unit 212 rinsing the release agent S on the template T away are two-tiered in order from the bottom. In the second treatment block G2, a release agent coating unit 213 and a rinse unit 214 are similarly two-tiered in order from the bottom. Further, chemical chambers 215, 216 each for supplying various treatment solutions to the solution treatment units are provided on the lowermost tiers of the first treatment block G1 and the second treatment block G2, respectively.

Figure 14:
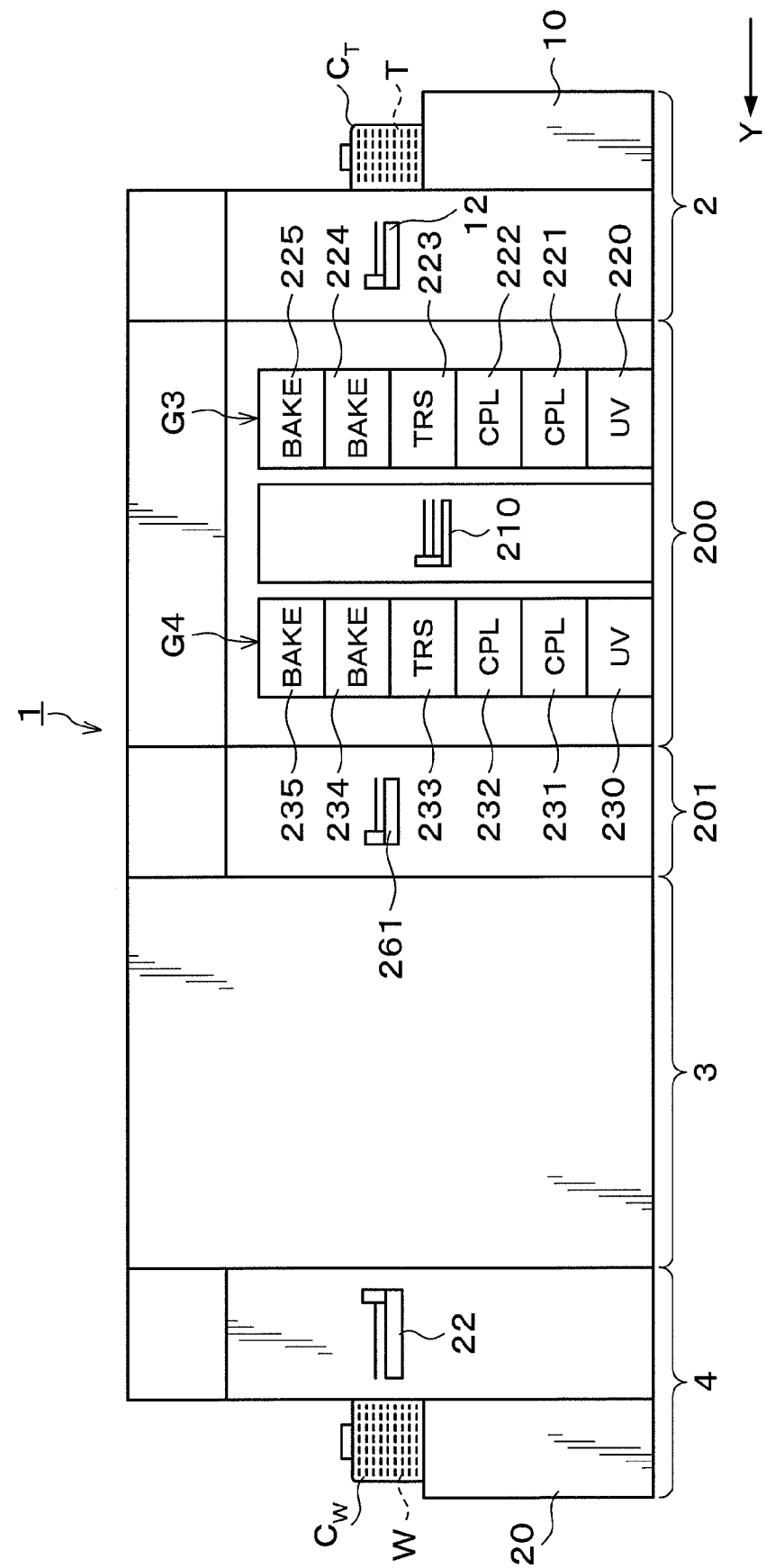
FIG. 14 A side view illustrating the outline of the internal configuration of the imprint system according to another embodiment.
Figure 15:
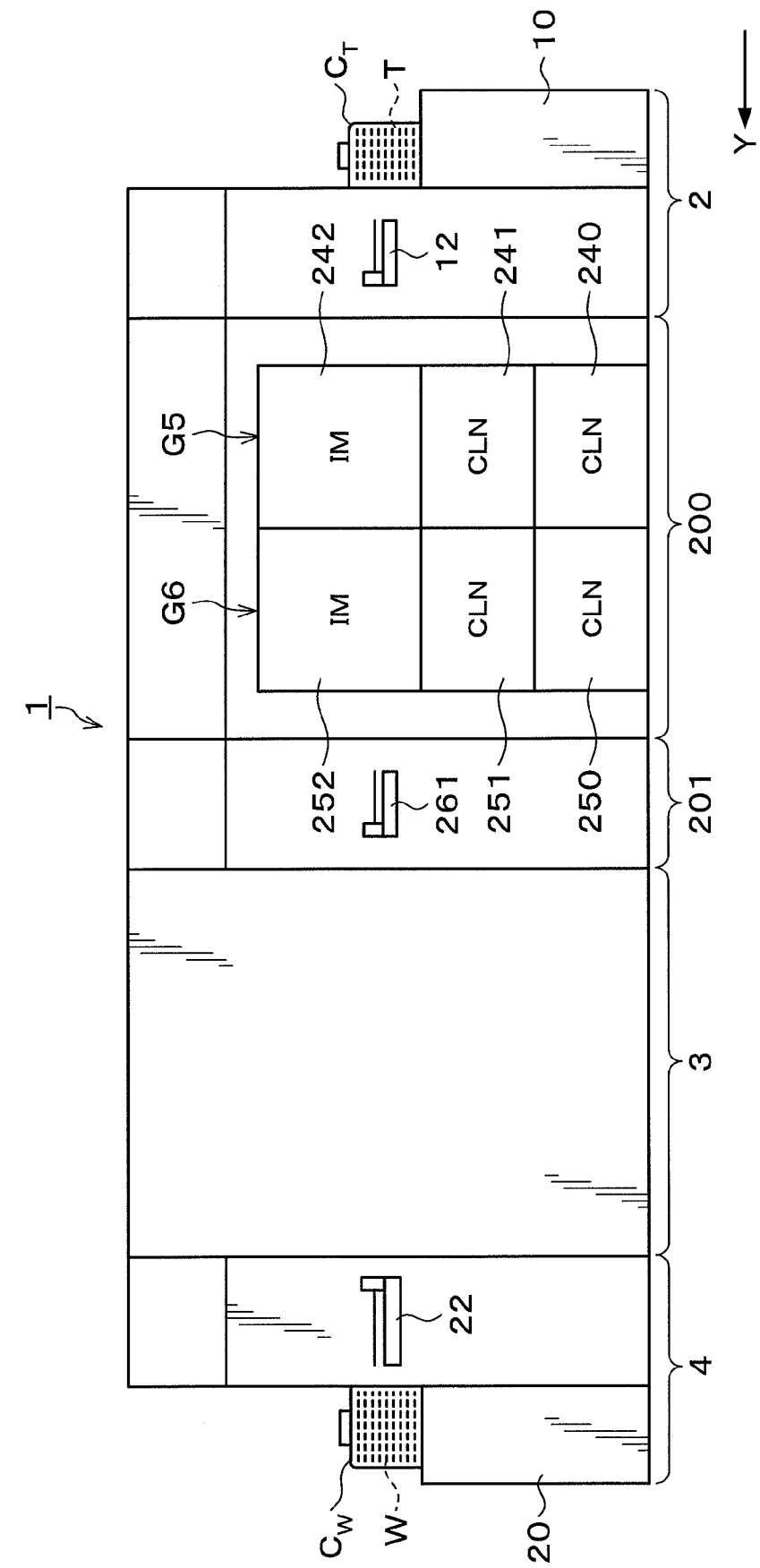
FIG. 15 A side view illustrating the outline of the configuration of the imprint system according to another embodiment.

In the third treatment block G3, as illustrated in FIG. 14, a pre-cleaning unit 220 irradiating the template T with ultraviolet light to clean the front surface $T_1$ before a film of the release agent S is formed on the template T, temperature regulation units 221, 222 each regulating the temperature of the template T, a transition unit 223 for passing the template T, and heating units 224, 225 each performing heat treatment on the template T are six-tiered in order from the bottom.

Also in the fourth treatment block G4, a pre-cleaning unit 230, temperature regulation units 231, 232, a transition unit 233, and heating units 234, 235 are six-tiered in order from the bottom as in the third treatment block G3.

In the fifth treatment block G5, post-cleaning units 240, 241 each cleaning the front surface $T_1$ of the used template T and an inspection unit 242 inspecting the cleaned front surface $T_1$ of the template T are three-tiered in order from the bottom.

Also in the sixth treatment block G6, post-cleaning units 250, 251 and an inspection unit 252 are three-tiered in order from the bottom as in the fifth treatment block G5. Note that the post-cleaning unit 240, 241, 250, 251 may further clean the rear surface $T_2$ of the template T, and the inspection unit 242, 252 may further inspect the rear surface $T_2$ of the template T.

In the interface station 201, a template carrying body 261 is provided which moves on a carry path 260 extending in the X-direction as illustrated in FIG. 12. Further, a reversing unit 13 reversing the front and rear surfaces of the template T is placed on the X-direction positive direction side of the carry path 260, and a buffer cassette 262 temporarily storing a plurality of templates T is placed on the X-direction negative direction side of the carry path 260. The template carrying body 261 is movable in the vertical direction and around the vertical (in the θ-direction), and thus can carry the template T between the treatment station 200, the reversing unit 13, the buffer cassette 262, and the imprint unit 3. Note that the reversing unit 13 in this embodiment is the one provided in the template carry-in/out station 2 illustrated in FIG. 1 which is moved to and disposed in the interface station 201.

Next, the configuration of the above-described carry unit 210 will be described. The carry unit 210 has a plurality of, for example, two carrying arms 270 holding and carrying the templates T as illustrated in FIG. 16.

Figure 17:
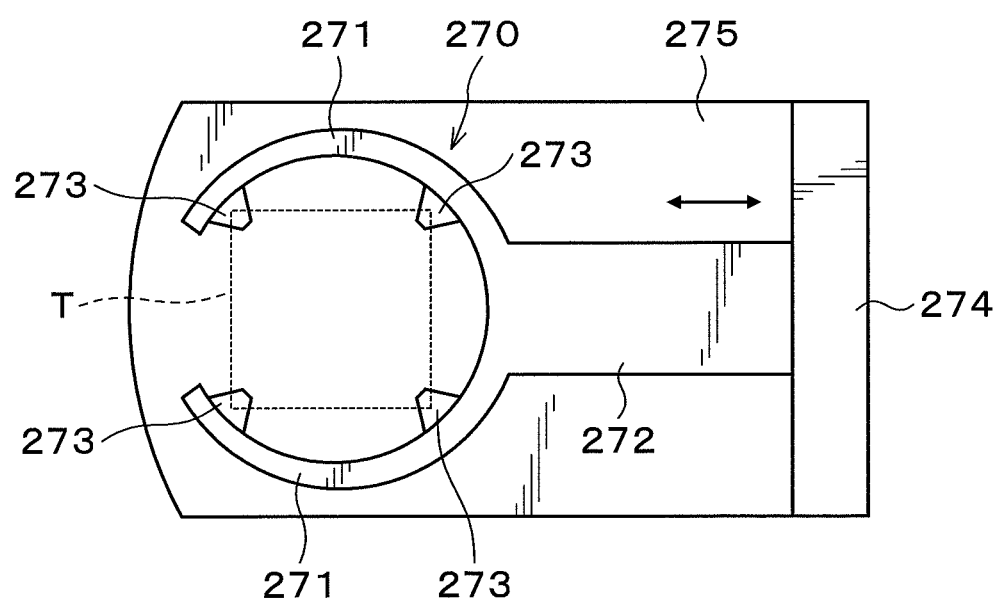
FIG. 17 A plan view illustrating the outline of the configuration of the carry unit.

The carrying arm 270 has an arm part 271 configured in an almost ¾ circular ring shape larger in radius than the template T and a support part 272 integrally formed with the arm part 271 and supporting the arm part 271 as illustrated in FIG. 17. The arm part 271 is provided with holding parts 273 projecting inward and holding the corner portions of the template T at a plurality of, for example, four locations. The carrying arm 270 can horizontally hold the template T on the holding parts 273.

Figure 16:
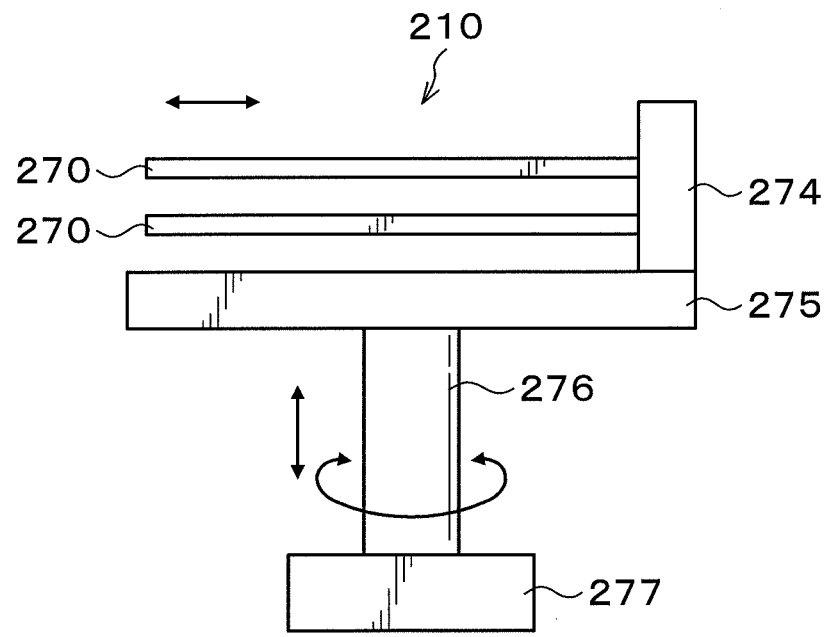
FIG. 16 A side view illustrating the outline of the configuration of a carry unit.

At the base end portion of the carrying arm 270, an arm drive part 274 is provided as illustrated in FIG. 16. By means of the arm drive part 274, each of the carrying arms 270 can independently move in the horizontal direction. The carrying arms 270 and the arm drive part 274 are supported on a base 275. At the lower surface of the base 275, a rotation drive part 277 is provided via a shaft 276. By means of the rotation drive part 277, the base 275 and the carrying arms 270 can rotate around the shaft 276 and move up and down.

Next, the configurations of the aforementioned release agent coating units 211, 213 will be described. The release agent coating unit 211 has a casing 280 having a carry-in/out port (not illustrated) for the template T formed in its side surface as illustrated in FIG. 18.

Figure 19:
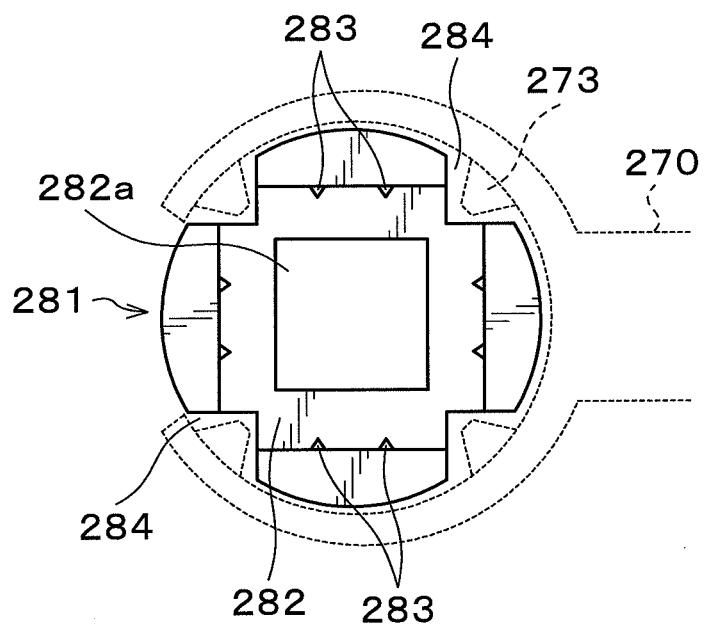
FIG. 19 A plan view illustrating the outline of the configuration of a holding member.

At a central portion in the casing 280, a holding member 281 holding and rotating the template T is provided. A central portion of the holding member 281 is recessed downward to form an accommodating part 282 accommodating the template T. Under the accommodating part 282, a groove part 282a that is smaller than the outer shape of the template T is formed. Accordingly, in the accommodating part 282, the inner peripheral portion of the lower surface of the template T is not in contact with the holding member 281 due to the groove part 282a, but only the outer peripheral portion of the lower surface of the template T is supported by the holding member 281. The accommodating part 282 has an almost quadrilateral planar shape conforming to the outer shape of the template T as illustrated in FIG. 19. In the accommodating part 282, a plurality of projecting parts 283 projecting inward from the side surfaces are formed so that the projecting parts 283 position the template T which is accommodated in the accommodating part 282. Further, to prevent the holing pats 273 of the carrying arm 270 from interfering with the accommodating part 282 when the template T is passed from the carrying arm 270 to the accommodating part 282, cutout parts 284 are formed at four locations on the outer periphery of the accommodating part 282.

Figure 18:
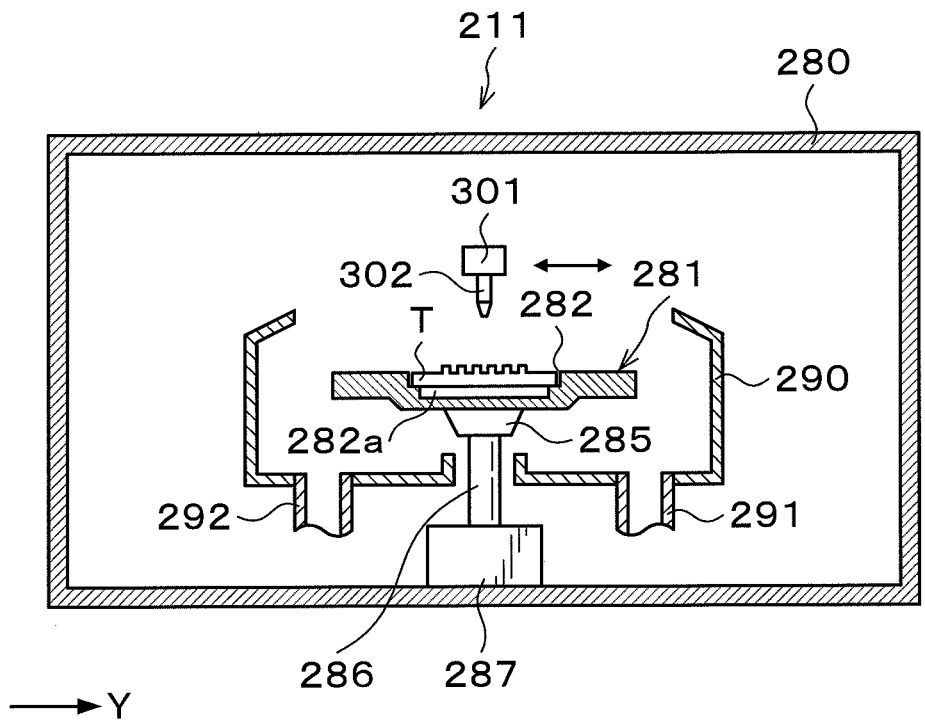
FIG. 18 A longitudinal sectional view illustrating the outline of the configuration of a release agent coating unit.

The holding member 281 is attached to a cover body 285 as illustrated in FIG. 18, and a rotation drive part 287 is provided below the holding member 281 via a shaft 286. By means of the rotation drive part 287, the holding member 281 can rotate at a predetermined speed around the vertical and move up and down.

Around the holding member 281, a cup 290 is provided which receives and recovers the release agent S splashing or dropping from the template T. A drain pipe 291 draining the recovered release agent S and an exhaust pipe 292 exhausting the atmosphere in the cup 290 are connected to the bottom surface of the cup 290.

Figure 20:
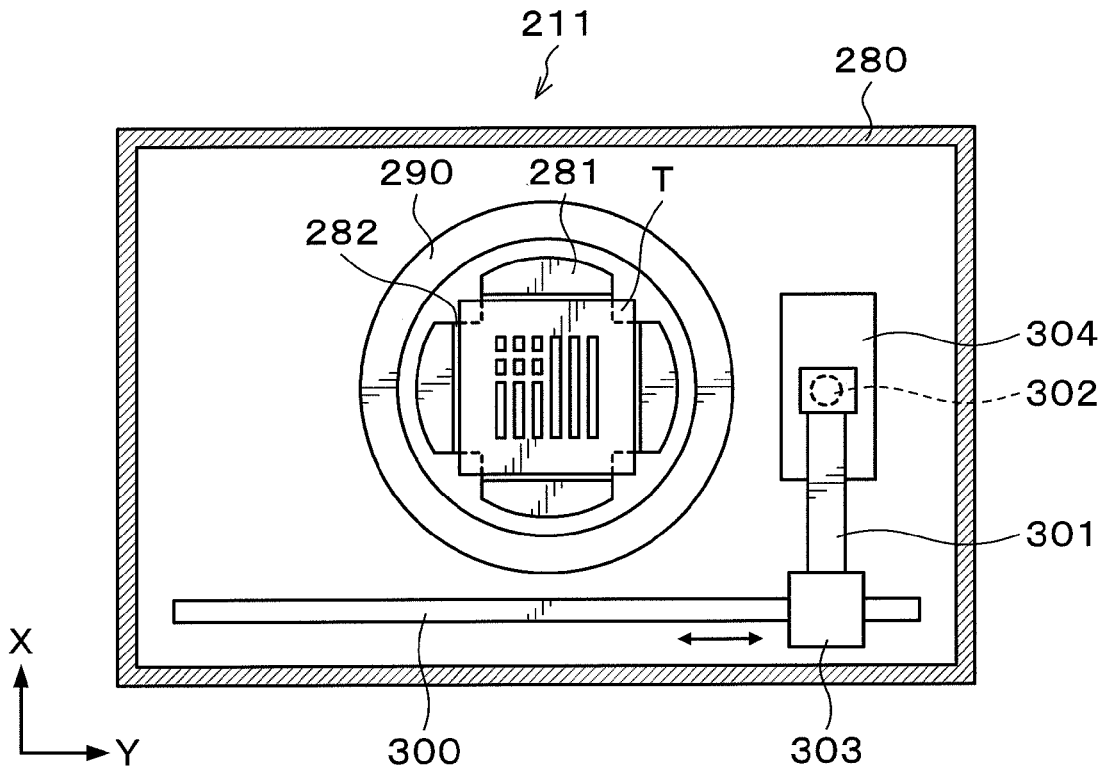
FIG. 20 A transverse sectional view illustrating the outline of the configuration of the release agent coating unit.

As illustrated in FIG. 20, on an X-direction negative direction (a downward direction in FIG. 20) side of the cup 290, a rail 300 extending along a Y-direction (a right and left direction in FIG. 20) is formed. The rail 300 is formed, for example, from a Y-direction negative direction (a left direction in FIG. 20) side outer position of the of the cup 290 to a Y-direction positive direction (a right direction in FIG. 20) side outer position. On the rail 300, for example, an arm 301 is attached.

On the arm 301, a release agent nozzle 302 supplying the release agent S onto the template T is supported. The arm 301 is movable on the rail 300 by means of a nozzle drive part 303. Thus, the release agent nozzle 302 can move from a waiting section 304 provided at a Y-direction positive direction side outer position of the cup 290 to a position above a central portion of the template T in the cup 290. Further, the arm 301 can freely move up and down by means of the nozzle drive part 303 to be able to adjust the height of the release agent nozzle 302.

Note that a cleaning solution nozzle jetting a cleaning solution, for example, an organic solvent may be provided inside the groove part 282a of the holding member 281. By jetting the cleaning solution from the cleaning solution nozzle to the rear surface $T_2$ of the template T, the rear surface $T_2$ can be cleaned.

Note that the configuration of the release agent coating unit 213 is the same as that of the above-described release agent coating unit 211, and therefore the description thereof will be omitted.

Figure 21:
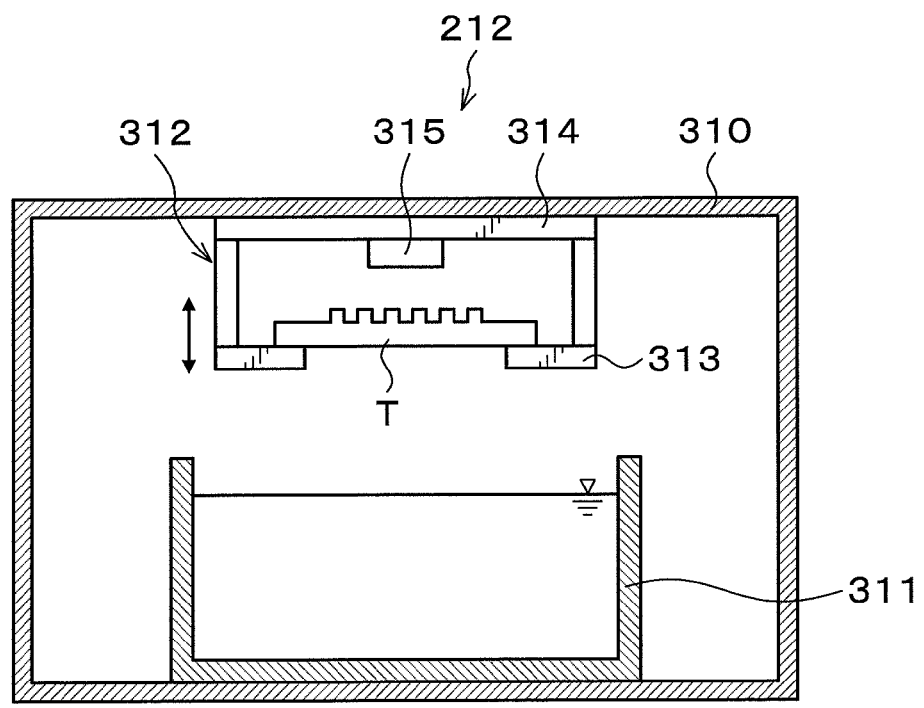
FIG. 21 A longitudinal sectional view illustrating the outline of the configuration of a rinse unit.

Next, the configurations of the aforementioned rinse units 212, 214 will be described. The rinse unit 212 has a casing 310 having a carry-in/out port (not illustrated) for the template T formed in its side surface as illustrated in FIG. 21.

On the bottom surface in the casing 310, an immersion bath 311 for immersing the template T is provided. In the immersion bath 311, the organic solvent for rinsing the release agent S on the template T away is stored.

On the ceiling surface in the casing 310 and above the immersion bath 311, a holding part 312 holding the template T is provided. The holding part 312 has a chuck 313 suction-holding the outer peripheral portion of the rear surface $T_2$ of the template T. The template T is held by the chuck 313 such that its front surface $T_1$ faces upward. The chuck 313 can move up and down by means of a raising and lowering mechanism 314. Then, the template T held by the holding part 312 is immersed in the organic solvent stored in the immersion bath 311 and the release agent S on the template T is rinsed away.

The holding part 312 has a gas supply part 315 provided above the template T held by the chuck 313. The gas supply part 315 can spray, for example, gaseous gas such an inert gas of nitrogen or dry air downward, namely, to the front surface $T_1$ of the template T held by the chuck 313. Thereby, the front surface $T_1$ of the template T rinsed in the immersion bath 311 can be dried. Note that an exhaust pipe (not illustrated) exhausting the atmosphere in the rinse unit 214 is connected to the rinse unit 214.

Note that the configuration of the rinse unit 214 is the same as that of the above-described rinse unit 212, and therefore the description thereof will be omitted.

Figure 22:
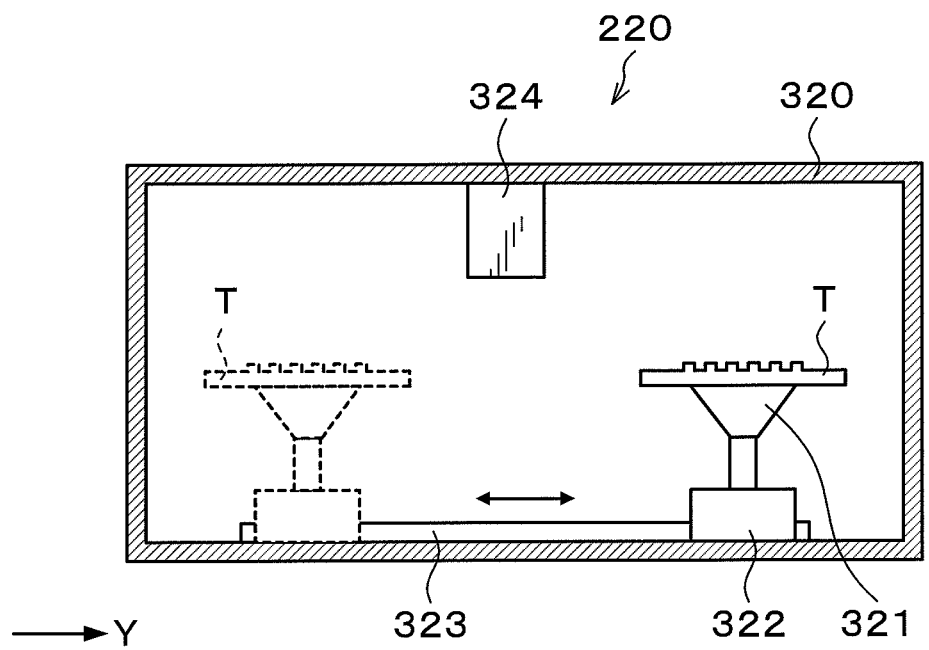
FIG. 22 A longitudinal sectional view illustrating the outline of the configuration of a pre-cleaning unit.

Next, the configurations of the aforementioned pre-cleaning units 220, 230 will be described. The pre-cleaning unit 220 has a casing 320 having a carry-in/out port (not illustrated) for the template T formed in its side surface as illustrated in FIG. 22.

In the casing 320, a chuck 321 suction-holding the template T is provided. The chuck 321 suction-holds the rear surface $T_2$ of the template T such that the front surface $T_1$ of the template T faces upward. Below the chuck 321, a chuck drive part 322 is provided. The chuck drive part 322 is attached on a rail 323 provided at the bottom surface in the casing 320 and extending along a Y-direction. By means of the chuck drive part 322, the chuck 321 can move along the rail 323.

Figure 23:
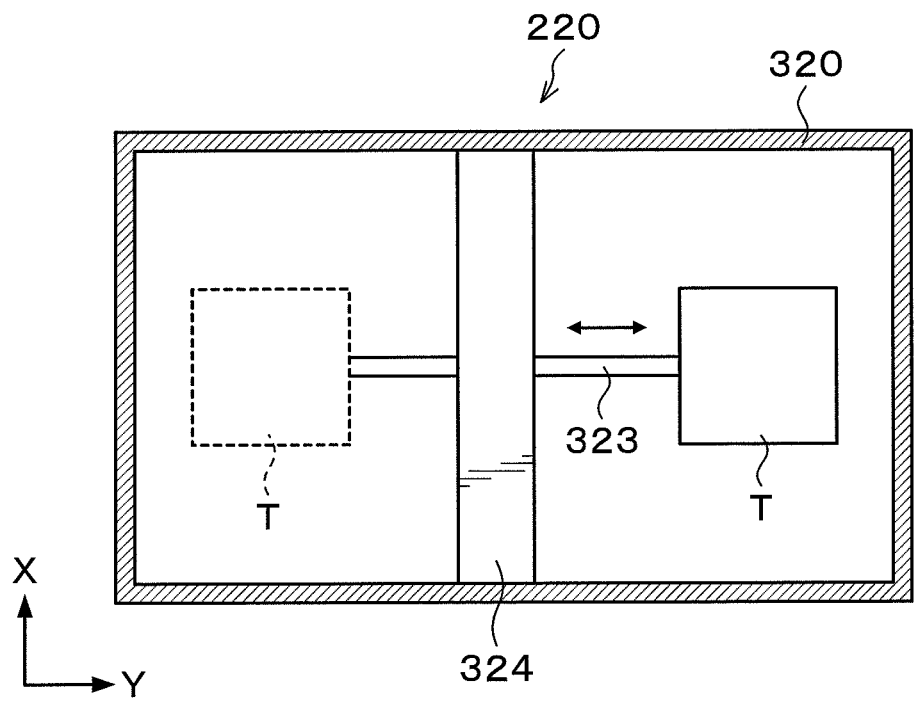
FIG. 23 A transverse sectional view illustrating the outline of the configuration of the pre-cleaning unit.

On the ceiling surface in the casing 320 and above the rail 323, an ultraviolet irradiation part 324 is provided which irradiates the template T held by the chuck 321 with ultraviolet light. The ultraviolet irradiation part 324 extends in an X-direction as illustrated in FIG. 23. The ultraviolet irradiation part 324 irradiates the front surface $T_1$ of the template T with ultraviolet light while the template T is moving along the rail 323, whereby the entire front surface $T_1$ of the template T is irradiated with the ultraviolet light.

Note that the configuration of the pre-cleaning unit 230 is the same as that of the above-described pre-cleaning unit 220, and therefore the description thereof will be omitted.

Figure 24:
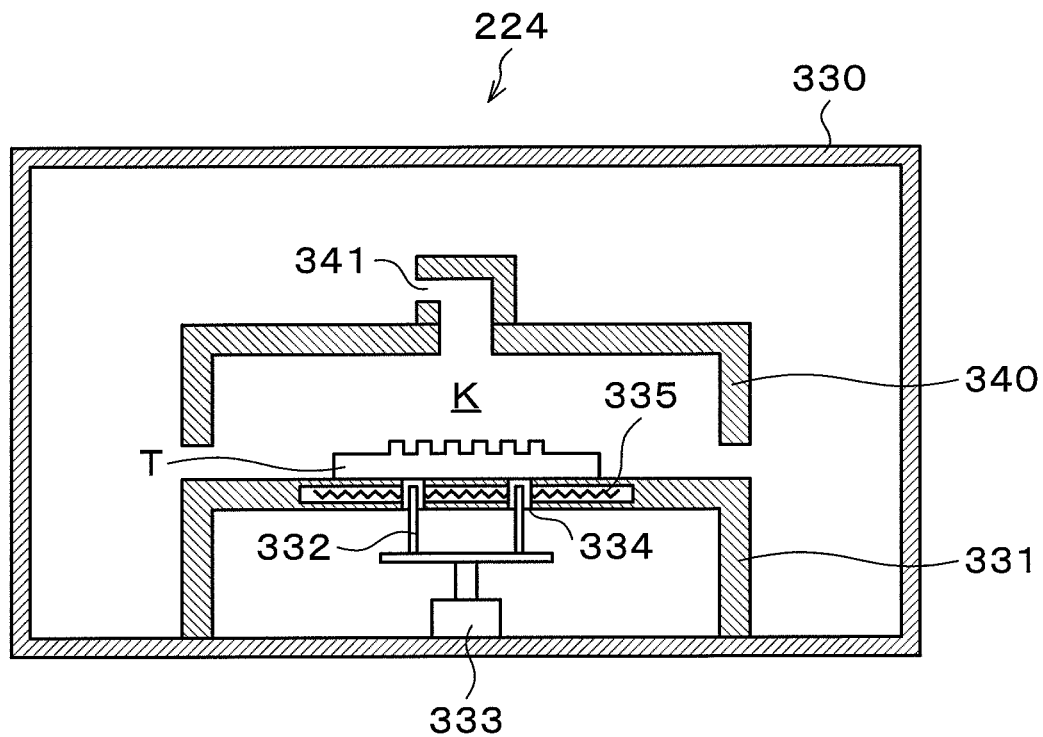
FIG. 24 A longitudinal sectional view illustrating the outline of the configuration of a heating unit.

Next, the configurations of the aforementioned heating units 224, 225, 234, 235 will be described. The heating unit 224 has a casing 330 having a carry-in/out port (not illustrated) for the template T formed in its side surface as illustrated in FIG. 24.

On the bottom surface in the casing 330, a mounting table 331 on which the template T is mounted is provided. The template T is mounted on the upper surface of the mounting table 331 such that its front surface $T_1$ faces upward. Inside the mounting table 331, raising and lowering pins 332 for supporting the template T from below and raising and lowering the template T are provided. The raising and lowering pins 332 can move up and down by means of a raising and lowering drive part 333. In the upper surface of the mounting table 331, through holes 334 penetrating the upper surface in the thickness direction are formed so that the raising and lowering pins 332 are inserted into the through holes 334. Further, a heating plate 335 heating the template T is provided in the upper surface of the mounting table 331. Inside the heating plate 335, a heater generating heat, for example, by power feeding is provided to be able to regulate the heating plate 335 to a predetermined temperature. Note that the heating plate 335 may be provided above the template T, for example, on the ceiling surface of a later-described lid body 340. Further, heating plates 335 may be provided above and below the template T.

Above the mounting table 331, the lid body 340 movable up and down is provided. The lid body 340 opens at its lower surface and forms a treatment chamber K together with the mounting table 331. At the middle portion of the upper surface of the lid body 340, an exhaust part 341 is provided. The atmosphere in the treatment chamber K is uniformly exhausted from the exhaust part 341.

Note that the configurations of the heating units 225, 234, 235 are the same as that of the above-described heating unit 224, and therefore the description thereof will be omitted.

Further, the configuration of the temperature regulation unit 221, 222, 231, 232 is similar to that of the above-described heating unit 224, in which a temperature regulating plate is used in place of the heating plate 335. A cooling member such as, for example, a Peltier element is provided in the temperature regulating plate and can regulate the temperature regulating plate to a set temperature. Further, in this case, the lid body 340 in the heating unit 224 may be omitted.

Figure 25:
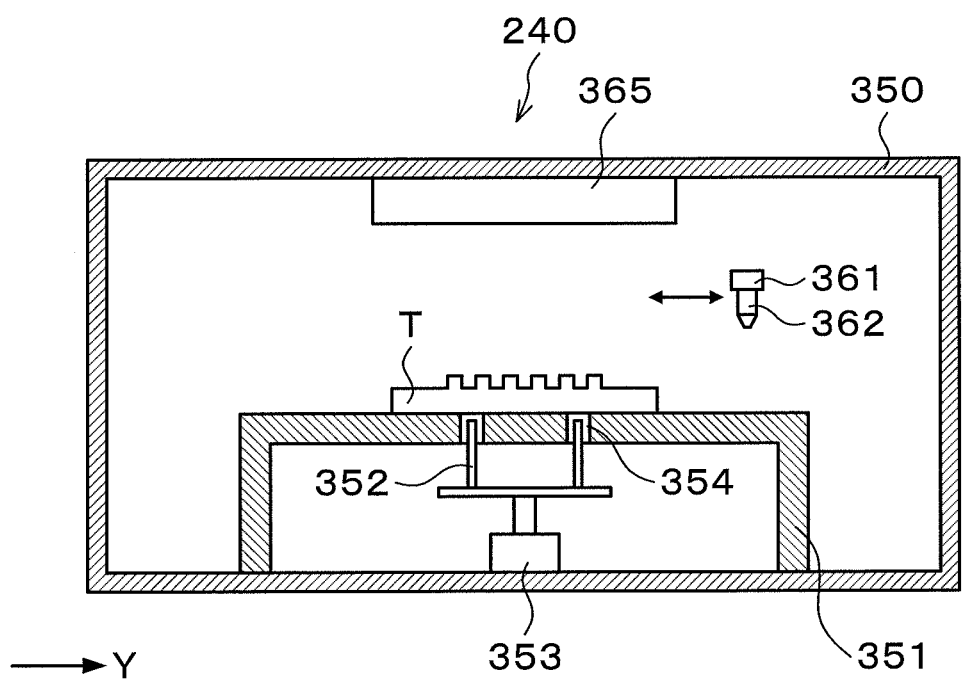
FIG. 25 A longitudinal sectional view illustrating the outline of the configuration of a post-cleaning unit.

Next, the configurations of the aforementioned post-cleaning units 240, 241, 250, 251 will be described. The post-cleaning unit 240 has a casing 350 having a carry-in/out port (not illustrated) for the template T formed in its side surface as illustrated in FIG. 25.

On the bottom surface in the casing 350, a mounting table 351 on which the template T is mounted is provided. The template T is mounted on the upper surface of the mounting table 351 such that its front surface $T_1$ faces upward. Inside the mounting table 351, raising and lowering pins 352 for supporting the template T from below and raising and lowering the template T are provided. The raising and lowering pins 352 can move up and down by means of a raising and lowering drive part 353. In the upper surface of the mounting table 351, through holes 354 penetrating the upper surface in the thickness direction are formed so that the raising and lowering pins 352 are inserted into the through holes 354.

Figure 26:
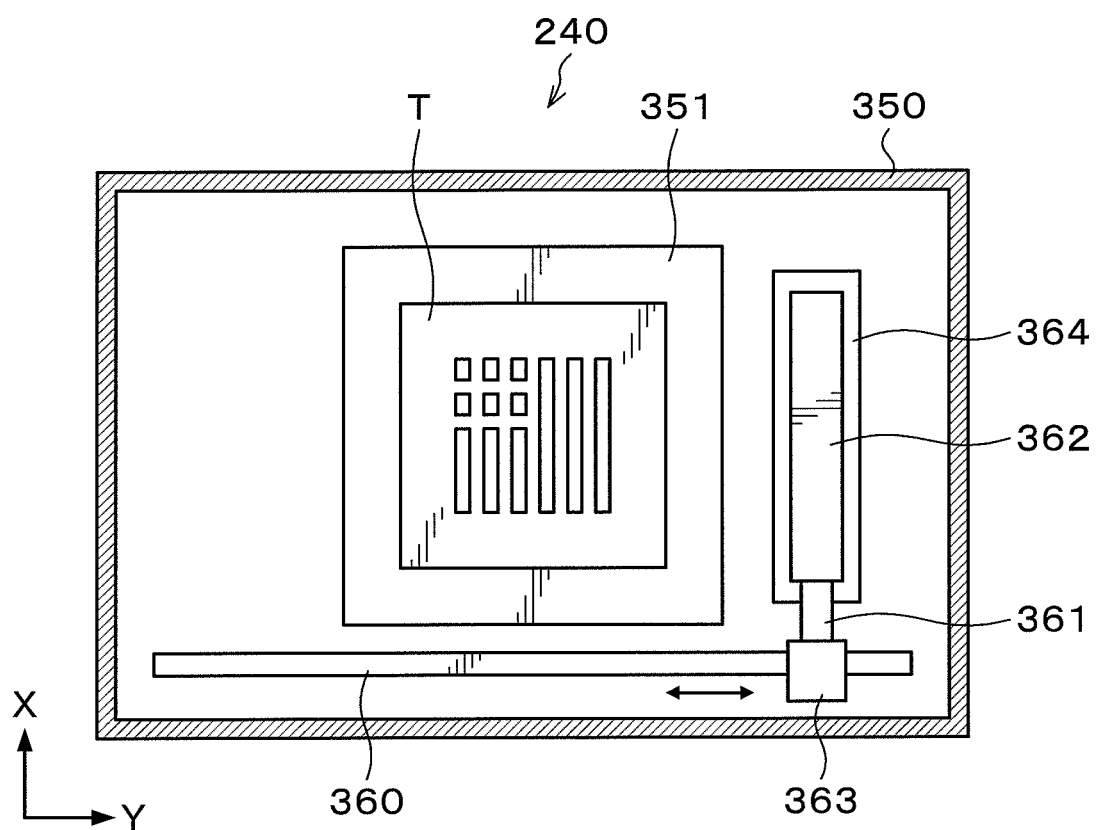
FIG. 26 A transverse sectional view illustrating the outline of the configuration of the post-cleaning unit.

As illustrated in FIG. 26, on an X-direction negative direction (a downward direction in FIG. 26) side of the mounting table 351, a rail 360 extending along a Y-direction (a right and left direction in FIG. 26) is provided. The rail 360 is formed, for example, from a Y-direction negative direction (a left direction in FIG. 26) side outer position of the mounting table 351 to a Y-direction positive direction (a right direction in FIG. 26) side outer position. On the rail 360, for example, an arm 361 is attached.

On the arm 361, a cleaning solution nozzle 362 as a cleaning solution supply part supplying a cleaning solution onto the template T is supported. The cleaning solution nozzle 362 has an elongated shape along the X-direction having, for example, the size equal to or longer than the dimension of one side of the template T. Note that, for example, organic solvent or pure water is used for the cleaning solution, and IPA (isopropyl alcohol), dibutyl ether, cyclohexane or the like is used as the organic solvent.

The arm 361 is movable on the rail 360 by means of a nozzle drive part 363. Thus, the cleaning solution nozzle 362 can move from a waiting section 364 provided at a Y-direction positive direction side outer position of the mounting table 351 to a position above the template T on the mounting table 351 and further move in the direction of the side of the template T above the front surface $T_1$ of the template T. Further, the arm 361 is movable up and down by means of the nozzle drive part 363 to be able to adjust the height of the cleaning solution nozzle 362.

On the ceiling surface in the casing 350 and above the mounting table 351, an ultraviolet irradiation part 365 is provided which irradiates the template T with ultraviolet light. The ultraviolet irradiation part 365 is disposed to face the front surface $T_1$ of the template T mounted on the mounting table 351, whereby the entire front surface $T_1$ of the template T can be irradiated with the ultraviolet light.

Note that the configurations of the post-cleaning units 241, 250, 251 are the same as that of the above-described post-cleaning unit 240, and therefore the description thereof will be omitted.

Figure 27:
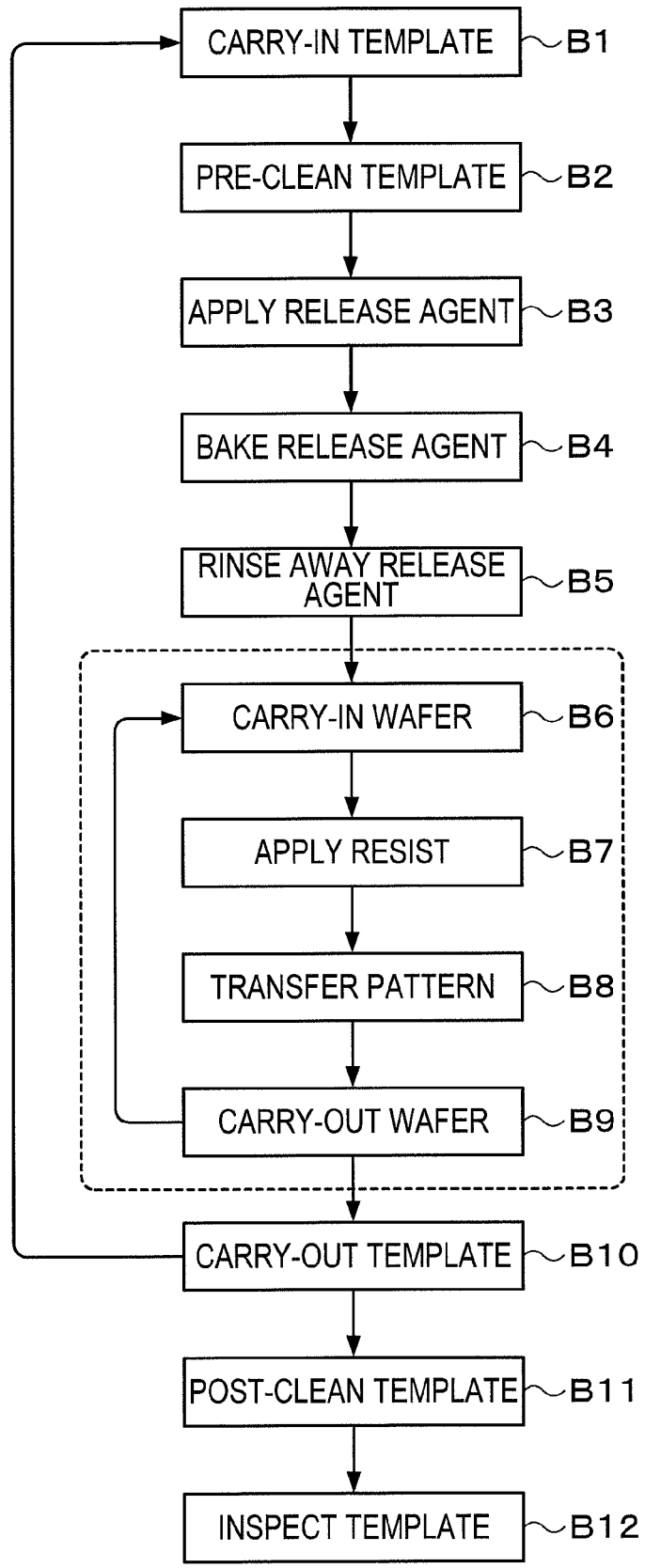
FIG. 27 A flowchart illustrating steps of imprint processing.
Figure 28:
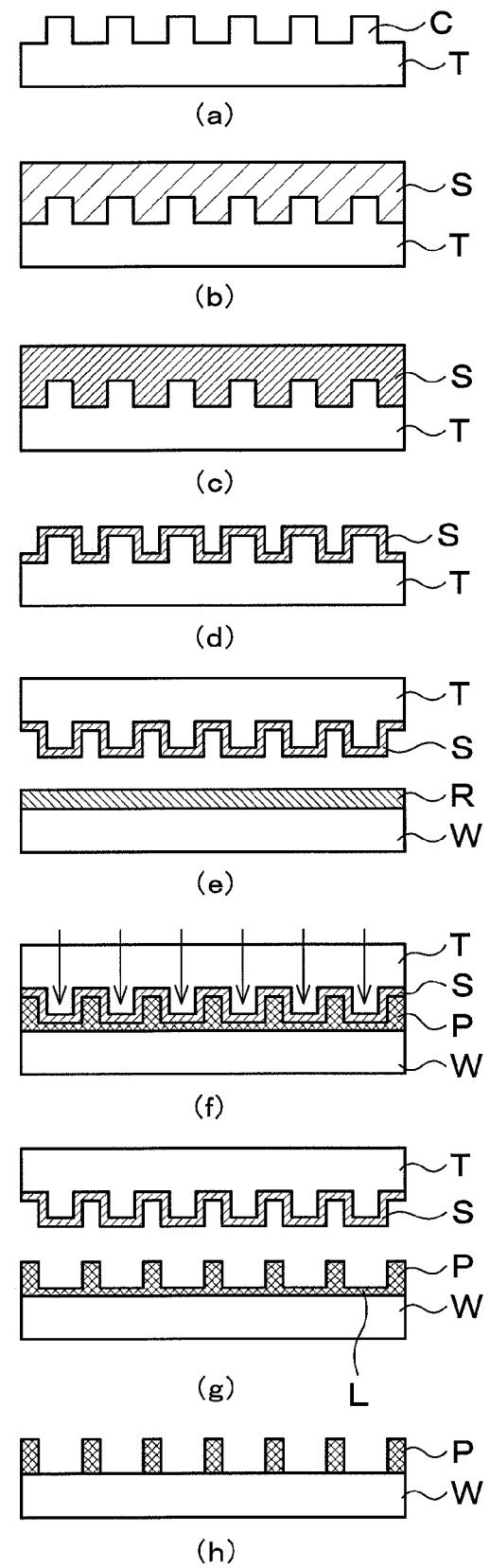
FIG. 28 An explanatory view schematically illustrating the states of a template and a wafer in respective steps of the imprint processing, (a) of FIG. 28 illustrating the appearance that the front surface of the template is cleaned, (b) of FIG. 28 illustrating the appearance that a release agent is applied on the front surface of the template, (c) of FIG. 28 illustrating the appearance that the release agent on the template is baked, (d) of FIG. 28 illustrating the appearance that a film of the release agent is formed on the template, (e) of FIG. 28 illustrating the appearance that a resist solution is applied on the wafer, (f) of FIG. 28 illustrating the appearance that photo polymerization of the resist film takes place, (g) of FIG. 28 illustrating the appearance that a resist pattern is formed on the wafer, and (h) of FIG. 28 illustrating the appearance that a residual film on the wafer is removed.

The imprint system 1 according to this embodiment is configured as described above. Next, the imprint processing performed in the imprint system 1 will be described. FIG. 27 illustrates a main processing flow of the imprint processing, and FIG. 28 illustrates the states of the template T and the wafer W in respective steps.

First of all, a template T is taken by the template carrying body 12 out of the template cassette $C_T$ on the cassette mounting table 10 and carried to the transition unit 223 in the third treatment block G3 of the treatment station 200 (Step B1 in FIG. 27).

The template T is then carried by the carry unit 210 to the pre-cleaning unit 220 and suction-held by the chuck 321. Subsequently, the template T is irradiated with the ultraviolet light from the ultraviolet irradiation part 324 while the template T is being moved along the rail 323 by the chuck drive part 322. In this manner, the ultraviolet light is applied to the entire front surface $T_1$ of the template T to clean the front surface $T_1$ of the template T as illustrated in FIG. 28(*a*) (Step B2 in FIG. 27).

The template T is then carried by the carry unit 210 to the release agent coating unit 211 and passed to the holding member 281. Subsequently, the release agent nozzle 302 is moved to a position above the central portion of the template T and the template T is rotated. Then, the release agent S is supplied onto the rotating template T and the release agent S is diffused over the template T by the centrifugal force, whereby the release agent S is applied on the entire front surface $T_1$ of the template T as illustrated in FIG. 28(*b*) (Step B3 in FIG. 27).

The template T is then carried by the carry unit 210 to the heating unit 224. The template T carried into the heating unit 224 is passed to the raising and lowering pins 332 and mounted on the mounting table 331. Subsequently, the lid body 340 is closed and the template T is heated by the heating plate 335 to, for example, 200° C. After a lapse of a predetermined period, the release agent S on the template T is baked as illustrated in FIG. 28(c) (Step B4 in FIG. 27).

Thereafter, the template T is carried by the carry unit 210 to the temperature regulation unit 221 and regulated to a predetermined temperature.

Thereafter, the template T is carried by the carry unit 210 to the rinse unit 212 and held by the holding part 312. Subsequently, the holding part 312 is lowered to immerse the template T in the organic solvent stored in the immersion bath 311. After a lapse of a predetermined period, only the unreacted portion of the release agent S peels off, whereby a film of the release agent S along the transfer pattern C is formed on the template T as illustrated in FIG. 28(d) (Step B5 in FIG. 27). Thereafter, the holding part 312 is moved up and the gaseous gas is sprayed from the gas supply part 315 to the template T to dry the front surface $T_1$ thereof. Note that the unreacted portion of the release agent S means a portion other than the portion of the release agent S chemically reacting with the front surface $T_1$ of the template T to adsorb onto the front surface $T_1$.

The template T is then carried by the carry unit 210 to the transition unit 233 in the fourth treatment block G4. The template T is subsequently carried by the template carrying body 261 in the interface station 201 to the reversing unit 13 and the front and rear surfaces of the template T are reversed. Thereafter, the template T is carried by the template carrying body 261 to the imprint unit 3 and suction-held by the chuck 51 of the template holding part 50.

The predetermined treatments are performed on the template T in the treatment station 200 in this manner, and during carry of the template T to the imprint unit 3, the wafer W is carried from the wafer carry-in/out station 4 to the imprint unit 3 (Step B6 in FIG. 27). This Step B6 is the same as the Step A2 in the above-described embodiment, and therefore the detailed description thereof will be omitted.

Thereafter, the resist solution is applied onto the wafer W in the imprint unit 3 as illustrated in FIG. 28(e) (Step B7 in FIG. 27), and the front surface $T_1$ of the template T is pressed against the resist film R on the wafer W as illustrated in FIG. 28(f) so that the transfer pattern C of the template T is transferred to the resist film R on the wafer W, whereby a resist pattern P is formed (Step B8 in FIG. 27). Thereafter, the template T is moved up as illustrated in FIG. 28(g), and the wafer W after the resist pattern P is formed thereon is returned to the wafer cassette $C_W$ (Step B9 in FIG. 27). Note that the Steps B7 to B9 are the same as the Steps A3 to A5 in the above-described embodiment, and therefore the detailed description thereof will be omitted. Further, after Step B9 is performed, the residual film L on the wafer W may be removed as illustrated in FIG. 28(h) as in the above-described embodiment.

By repeatedly performing the above Steps B6 to B9 (a part surrounded by a dotted line in FIG. 27), resist patterns P are formed respectively on a plurality of wafers W using one template T. During this time, the above-described Steps B1 to B5 are repeatedly performed to form films of the release agent S on the front surfaces $T_1$ of a plurality of templates T. The templates T on which the films of the release agent S have been formed are stored in the buffer cassette 262 in the interface station 201. Then, after Steps B6 to B9 are performed on a predetermined number of wafers W, the used template T is carried by the template carrying body 261 out of the imprint unit 3 and carried to the reversing unit 13 (Step B10 in FIG. 27). The front and rear surfaces of the used template T carried to the reversing unit 13 are reversed. The template T is then carried by the template carrying body 261 to the transition unit 233 in the fourth treatment block G4. Subsequently, the template T in the buffer cassette 262 is carried by the template carrying body 261 into the imprint unit 3. Thus, the template T in the imprint unit 3 is replaced.

The template T carried into the transition unit 233 is then carried by carry unit 210 to the post-cleaning unit 240. The template T carried into the post-cleaning unit 240 is passed to the raising and lowering pins 352 and mounted on the mounting table 351. Subsequently, the entire front surface $T_1$ of the template T is irradiated with the ultraviolet light from the ultraviolet irradiation part 365. Then, the release agent S on the template T vaporizes, and almost all of the release agent S is removed. After a lapse of a predetermined period, the irradiation of the ultraviolet light is stopped, and the cleaning solution is supplied to the release agent S remaining on the template T while the cleaning solution nozzle 362 is being moved in the direction of the side of the template T. In this manner the release agent S on the template T is removed, whereby the front surface $T_1$ is cleaned (Step B11 in FIG. 27). Note that when pure water is used as the cleaning solution, it is preferable to further clean the front surface $T_1$ using IPA that is an organic solvent thereafter in order to prevent watermark from adhering to the front surface $T_1$ of the template T. Note that not only the front surface $T_1$ of the template T but also the rear surface $T_2$ may be cleaned in the post-cleaning unit 240.

The template T is then carried by the carry unit 210 to the inspection unit 242. In the inspection unit 242, the front surface $T_1$ of the template T is then inspected, for example, by observation using interference fringes or the like (Step B12 in FIG. 27). Note that not only the front surface $T_1$ of the template T but also the rear surface $T_2$ may be inspected in the inspection unit 242.

The template T is then carried by the carry unit 210 to the transition unit 223 and returned by the template carrying body 12 to the template cassette $C_T$. Note that when the inspection result by the inspection unit 242 is good, for example, when the front surface $T_1$ of the template T has been appropriately cleaned and the front surface $T_1$ has not deteriorated, the template T returned to the template cassette $C_T$ is used again in the imprint system 1. On the other hand, when the inspection result by the inspection unit 242 is bad, for example, when the front surface $T_1$ of the template T has deteriorated, the template T is carried to the outside of the imprint system 1.

In this manner, predetermined resist patterns P are successively formed on a plurality of wafers W while the template T is successively replaced in the imprint system 1.

According to the above embodiment, the treatment blocks G1 to G4 constituting the release agent treatment block are provided in the treatment station 200, so that the templates T can be successively supplied to the imprint unit 3 while the film of the release agent S is being formed on the template T in the imprint system 1. Thus, before the template T deteriorates or even when different resist patterns P are formed on a plurality of wafers W, the template T in the imprint unit 3 can be successively and efficiently replaced. Accordingly, predetermined resist patterns P can be successively formed on a plurality of wafers W.

Further, the treatment blocks G5, G6 constituting the template cleaning block are provided in the treatment station 200. More specifically, since the post-cleaning units 240, 241, 250, 251 are provided, the front surface $T_1$ of the used template T can be cleaned in the imprint system 1. Thus, the template T can be used again in the imprint system 1.

Further, since the ultraviolet irradiation part 365 and the cleaning solution nozzle 362 are provided in the post-cleaning unit 240, 241, 250, 251, the front surface $T_1$ of the template T can be cleaned both with the ultraviolet light applied from the ultraviolet irradiation part 365 and the cleaning solution supplied from the cleaning solution nozzle 362. In other words, since both dry cleaning and wet cleaning are performed on the template T, the front surface $T_1$ of the template T can be surely cleaned.

Further, the ultraviolet irradiation part 365 can apply the ultraviolet light to the entire front surface $T_1$ of the template T by one time irradiation and thus can rapidly perform the dry cleaning on the template T.

Furthermore, since the inspection units 242, 252 are provided in the treatment station 200, the front surface $T_1$ of the template T after the cleaning can be inspected. Then, based on the inspection result, whether to use the template T again in the imprint system 1 or to carry the template T to the outside of the imprint system 1 can be decided. This makes it possible to effectively use the template T and avoid the use of a defective template T in the imprint system 1, thus appropriately forming predetermined resist patterns P on a plurality of wafers W.

Figure 29:
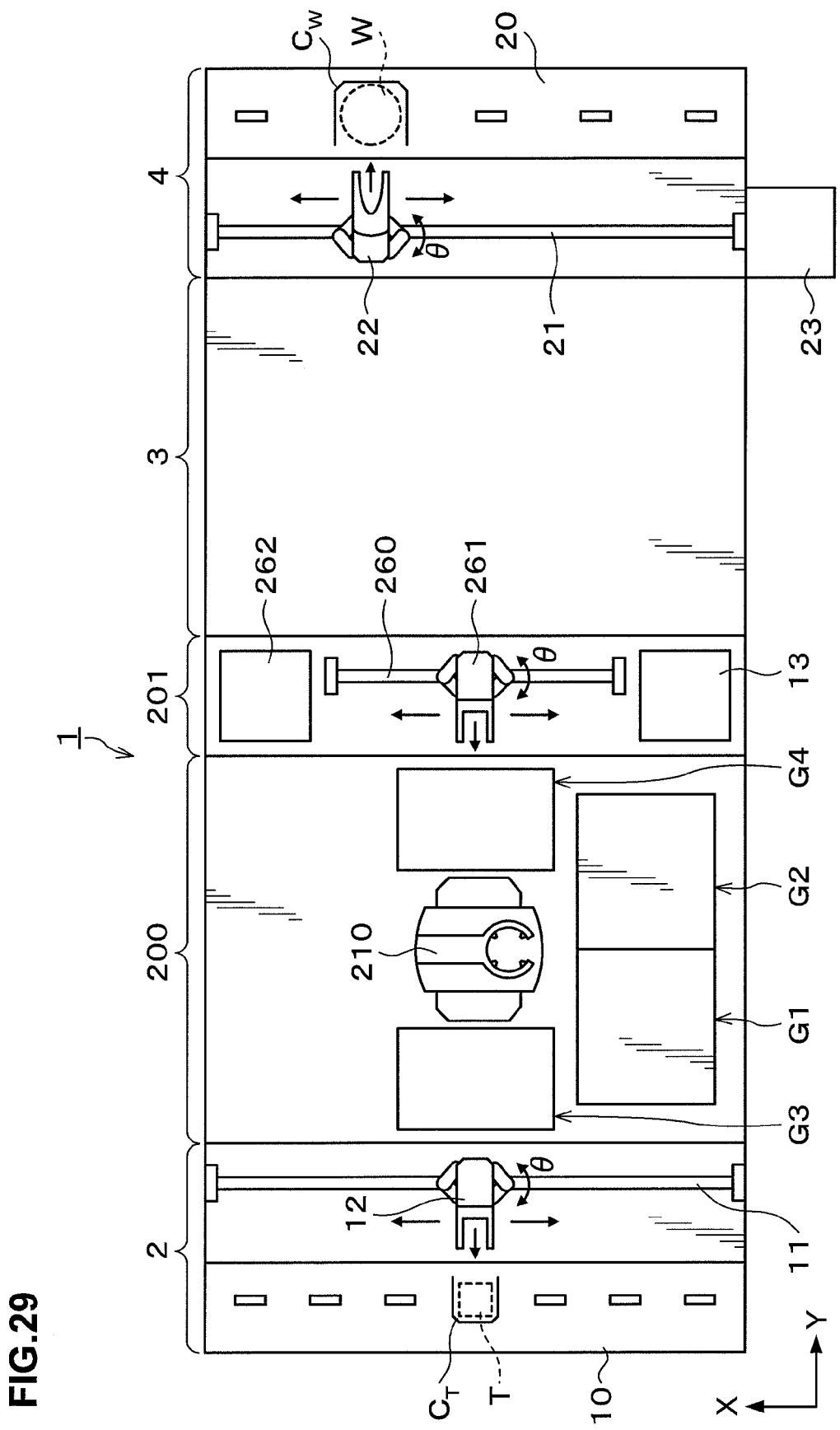
FIG. 29 A plan view illustrating the outline of the configuration of an imprint system according to another embodiment.
Figure 30:
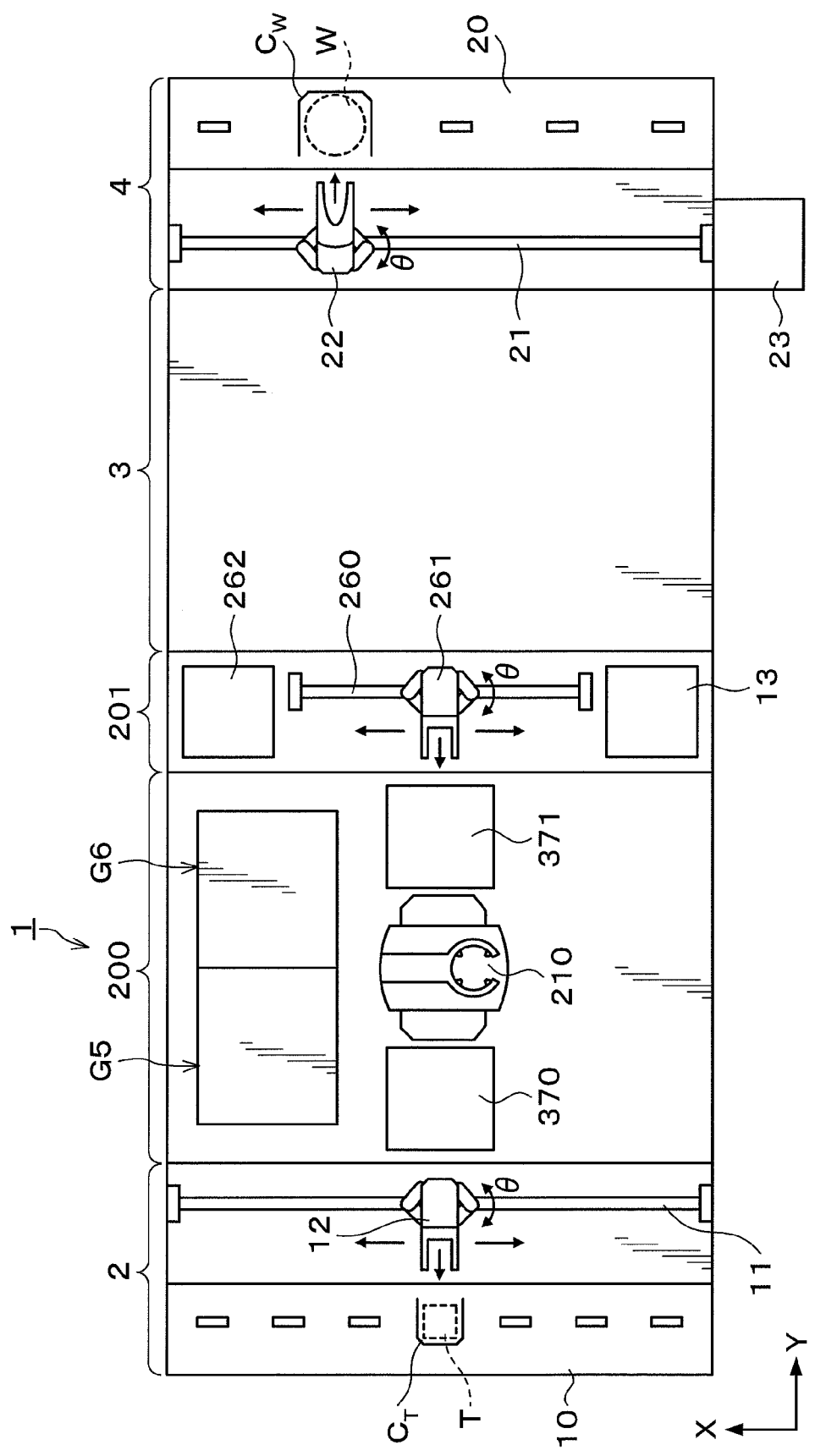
FIG. 30 A plan view illustrating the outline of the configuration of an imprint system according to another embodiment.

Note that though both the treatment blocks G1 to G4 constituting the release agent treatment block and the treatment blocks G5, G6 constituting the template cleaning block are provided in the treatment station 200 of the above embodiment, only the treatment blocks G1 to G4 being the release agent treatment block may be provided in the treatment station 200 as illustrated, for example, in FIG. 29. In this case, Steps B11, B12 in the above embodiment are omitted, and the cleaning of the front surface $T_1$ of the used template T is performed outside the imprint system 1. Further, as illustrated in FIG. 30, the treatment blocks G5, G6 being the template cleaning block may be provided in the treatment station 200 and transition units 370, 371 for passing the template T may be provided at the positions of the treatment blocks G3, G4 respectively. In this case, Steps B2 to B5 in the above embodiment are omitted, and the film formation of the release agent S on the template T is performed outside the imprint system 1. In other words, the template T on which the film of the release agent S has been formed is carried into the imprint system 1. In any case, the template T in the imprint unit 3 can be successively replaced, and predetermined resist patterns P can be successively formed on a plurality of wafers W.

Though the release agent S is applied on the front surface $T_1$ of the template T by supplying the release agent S onto the rotating template T in the release agent coating unit 211, 213 of the above embodiment, the release agent S may be applied onto the template T using, for example, a release agent nozzle extending in the width direction of the template T and having a supply port in a slit shape formed in the lower surface. In this case, the release agent S is supplied from the supply port while the release agent nozzle is being moved in the direction of the side of the template T, whereby the release agent S is applied on the entire front surface $T_1$ of the template T. Note that in this case, the release agent nozzle may be fixed and the template T may be moved. Further, the release agent S may be applied on the template T, for example, by immersing the template T in the immersion bath storing the release agent S.

Though the release agent S is rinsed away by immersing the template T in the organic solvent stored in the immersion bath 311 in the rinse unit 212, 214 of the above embodiment, a rinse unit having a configuration similar to that of the release agent coating unit 211, 214 illustrated in FIG. 18 and FIG. 20 may be used. In this case, a rinse solution nozzle supplying an organic solvent as a rinse solution for the release agent S onto the template T is used in place of the release agent nozzle 302 of the release agent coating unit 211, 214.

In this rinse unit, the organic solvent is supplied onto the rotating template T to rinse the entire front surface $T_1$ of the template T. After a lapse of a predetermined time, only the unreacted portion of the release agent S peels off, whereby a film of the release agent S along the transfer pattern C is formed on the template T. Then, after the supply of the organic solvent is stopped, the template T is further continuously rotated to spin-dry the front surface $T_1$. In this manner, the release agent S on the template T is rinsed away.

Though both the ultraviolet irradiation part 365 and the cleaning solution nozzle 362 are provided in the post-cleaning unit 240, 241, 250, 251 of the above embodiment, only one of them may be provided. For example, when the front surface $T_1$ of the template T is cleaned only with application of the ultraviolet light, only the ultraviolet irradiation part 365 may be provided and the cleaning solution nozzle 362 may be omitted in the post-cleaning unit 240 illustrated in FIG. 25 and FIG. 26. On the other hand, when the front surface $T_1$ of the template T is cleaned only with supply of the cleaning solution, only the cleaning solution nozzle 362 may be provided and the ultraviolet irradiation part 365 may be omitted in the post-cleaning unit 240 illustrated in FIG. 25 and FIG. 26. In this case, an organic solvent is used as the cleaning solution. Note that, for example, when IPA is used as the organic solvent, the release agent S can be removed only with the IPA. On the other hand, for example, when dibutyl ether or cyclohexane is used, it is preferable to further supply IPA after supply of the organic solvent, to remove the release agent S.

Further, a unit using only the above-described ultraviolet irradiation part 365 and a unit using only the cleaning solution nozzle 362 may be used in combination in place of the post-cleaning unit 240, 241, 250, 251. In this case, the application of the ultraviolet light to the template T and the supply of the cleaning solution are performed in the separate units. Further, in this case, the release agent S on the template T may be removed by supplying the cleaning solution from above the central portion of the rotating template T and diffusing the cleaning solution over the entire front surface $T_1$ as will be described later in the unit using only the cleaning solution nozzle 362.

Further, though the cleaning solution is supplied over the entire front surface $T_1$ of the template T by moving the cleaning solution nozzle 362 in the post-cleaning unit 240, 241, 250, 251, a unit having a configuration similar to that of the release agent coating unit 211, 214 illustrated in FIG. 18 and FIG. 20 may be used. In this case, the cleaning solution nozzle 362 is provided in place of the release agent nozzle 302 of the release agent coating unit 211, 214. Further, in this unit, the release agent S on the template T is removed by rotating the template T and supplying the cleaning solution from above the central portion of the rotating template T to diffuse the cleaning solution over the entire front surface $T_1$.

Further, in place of the post-cleaning unit 240, 241, 250, 251, a unit having an immersion bath storing, for example, the cleaning solution may be used. In this case, the release agent S on the template T is removed by immersing the template T in the cleaning solution in the immersion bath.

Further, though the ultraviolet irradiation part 365 irradiates the entire front surface $T_1$ of the template T with the ultraviolet light in the post-cleaning unit 240, 241, 250, 251, a unit having a configuration similar to that of the pre-cleaning unit 220 illustrated in FIG. 22 and FIG. 23 may be used to irradiate the moving template T with the ultraviolet light while the template T is being moved.

On the other hand, a unit having a configuration similar to that of in the post-cleaning unit 240 illustrated in FIG. 25 and FIG. 26, namely, an ultraviolet irradiation part similar to the ultraviolet irradiation part 365 may be used also in the pre-cleaning unit 220, 230 to irradiate the entire front surface $T_1$ of the template T with the ultraviolet light. Further, in this case, the template T may be rotated and the entire front surface $T_1$ of the rotating template T may be irradiated with the ultraviolet light as in the release agent coating unit 211, 214 illustrated in FIG. 18 and FIG. 20.

Though the template holding part 50 is provided above the wafer holding part 31 in the imprint unit 3 in the above embodiment, a template holding part may be provided below a wafer holding part.

Figure 31:
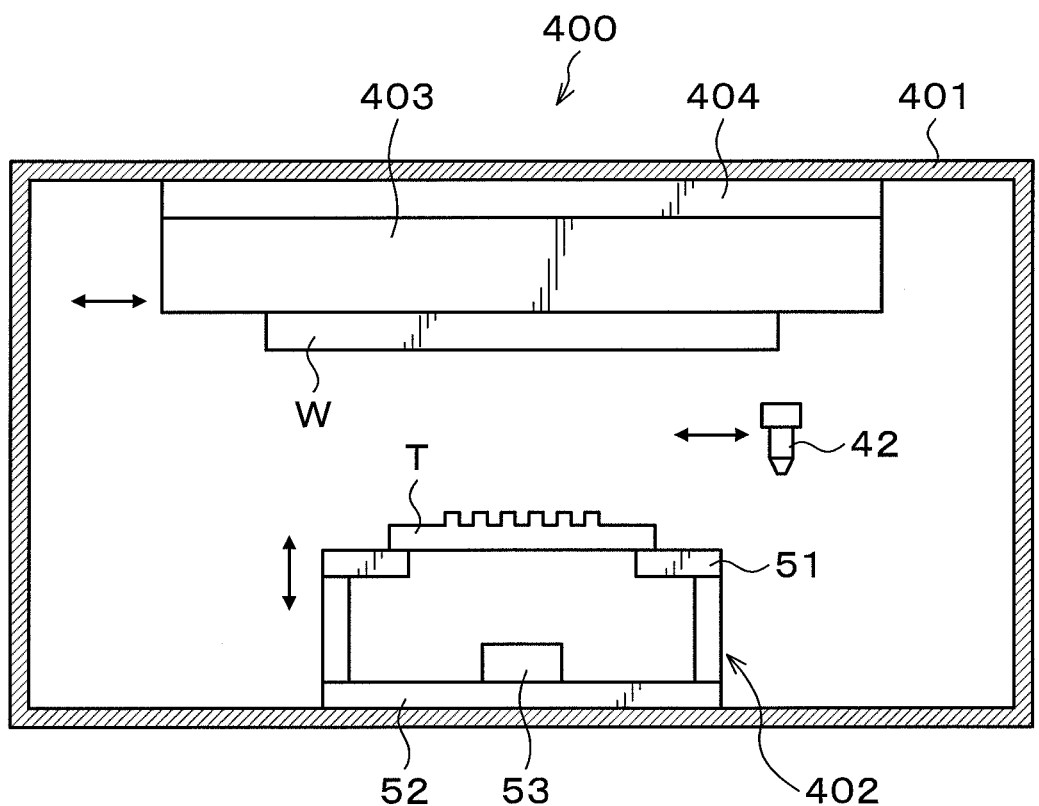
FIG. 31 A longitudinal sectional view illustrating the outline of the configuration of an imprint unit according to another embodiment.

In this case, a template holding part 402 is provided at the bottom surface of a casing 401 of an imprint unit 400 as illustrated in FIG. 31. The template holding part 402 has a configuration similar to that of the template holding part 50 illustrated in FIG. 5 and FIG. 6 and is the template holding part 50 disposed reversed in the vertical direction. Therefore, the template T is held by the template holding part 402 such that its front surface $T_1$ faces upward. Further, the light emitted from the light source 53 of the template holding part 402 is applied upward.

On the ceiling surface in the casing 401 and above the template holding part 402, a wafer holding part 403 is provided. The wafer holding part 403 suction-holds the rear surface of the wafer W such that the surface to be processed of the wafer W faces downward. The wafer holding part 403 is configured to be movable in the horizontal direction by means of a moving mechanism 404 provided above the wafer holding part 403.

Note that the other configuration of the imprint unit 400 is the same as that of the imprint unit 3 illustrated in FIG. 5 and FIG. 6, and therefore the description thereof will be omitted.

Figure 32:
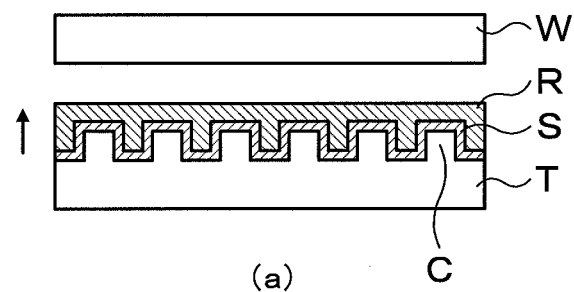
FIG. 32 An explanatory view schematically illustrating the states of a template and a wafer in respective steps of the imprint processing, (a) of FIG. 32 illustrating the appearance that a resist solution is applied on the template, (b) of FIG. 32 illustrating the appearance that photo polymerization of the resist film on the template takes place, (c) of FIG. 32 illustrating the appearance that a resist pattern is formed on the wafer, and (d) of FIG. 32 illustrating the appearance that a residual film on the wafer is removed.
Figure 32:
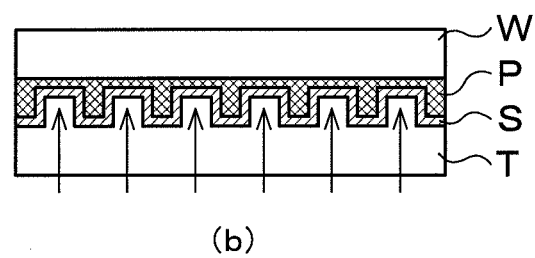
Figure 32:
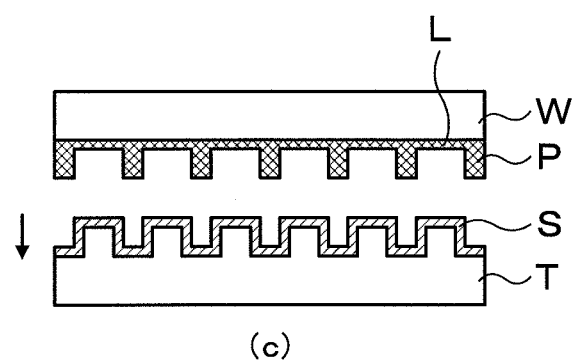
Figure 32:
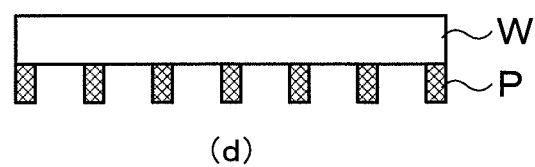

Next, the imprint processing performed in the imprint unit 400 configured as described above will be described. FIG. 32 illustrates the states of the template T and the wafer W in main steps.

First of all, a template T and a wafer W are carried into the imprint unit 400 and suction-held by the template holding part 402 and the wafer holding part 403 respectively.

Thereafter, the resist solution nozzle 42 is moved in the direction of the side of the template T, and supplies the resist solution onto the template T as illustrate in FIG. 32($a$) to form a resist film R. In this event, the resist solution is applied onto the template T such that the amount of the resist solution to be applied to a portion corresponding to a recessed portion in the transfer pattern C of the template T (a portion corresponding to a protruding portion in the resist pattern P to be formed on the wafer W) is large, while the amount of the resist solution to be applied to a portion corresponding to a protruding portion in the transfer pattern C (a portion corresponding to a recessed portion in the resist pattern P) is small. The resist solution is applied onto the template T according to the aperture ratio of the transfer pattern C as described above.

Upon application of the resist film R on the template T, the wafer W held on the wafer holding part 403 is moved to a predetermined position in the horizontal direction to be aligned, and the template T held by the template holding part 402 is rotated in a predetermined orientation. The template T is then moved up toward the wafer W as illustrated by an arrow in FIG. 32($a$). The template T is moved up to a predetermined position, and the front surface $T_1$ of the template T is pressed against the resist film R on the wafer W. Subsequently, light is applied from the light source 53. The light from the light source 53 is transmitted through the template T and applied to the resist film R on the wafer W as illustrated in FIG. 32($b$), whereby photo polymerization of the resist film R takes place. In this manner, the transfer pattern C of the template T is transferred to the resist film R on the wafer W, whereby a resist pattern P is formed.

Thereafter, the template T is moved down as illustrated in FIG. 32($c$), whereby the resist pattern P is formed on the wafer W. Note that the residual film L on the wafer W may be removed as illustrated in FIG. 32($d$) after the wafer W is carried out of the imprint unit 400.

According to the above embodiment, since the resist solution is applied onto the template T, it is unnecessary to perform the alignment of the wafer W which has been performed when applying the resist solution onto the wafer W in the above embodiment. Accordingly, it is possible to rapidly and efficiently form the resist pattern P on the wafer W in the imprint unit 400.

Figure 33:
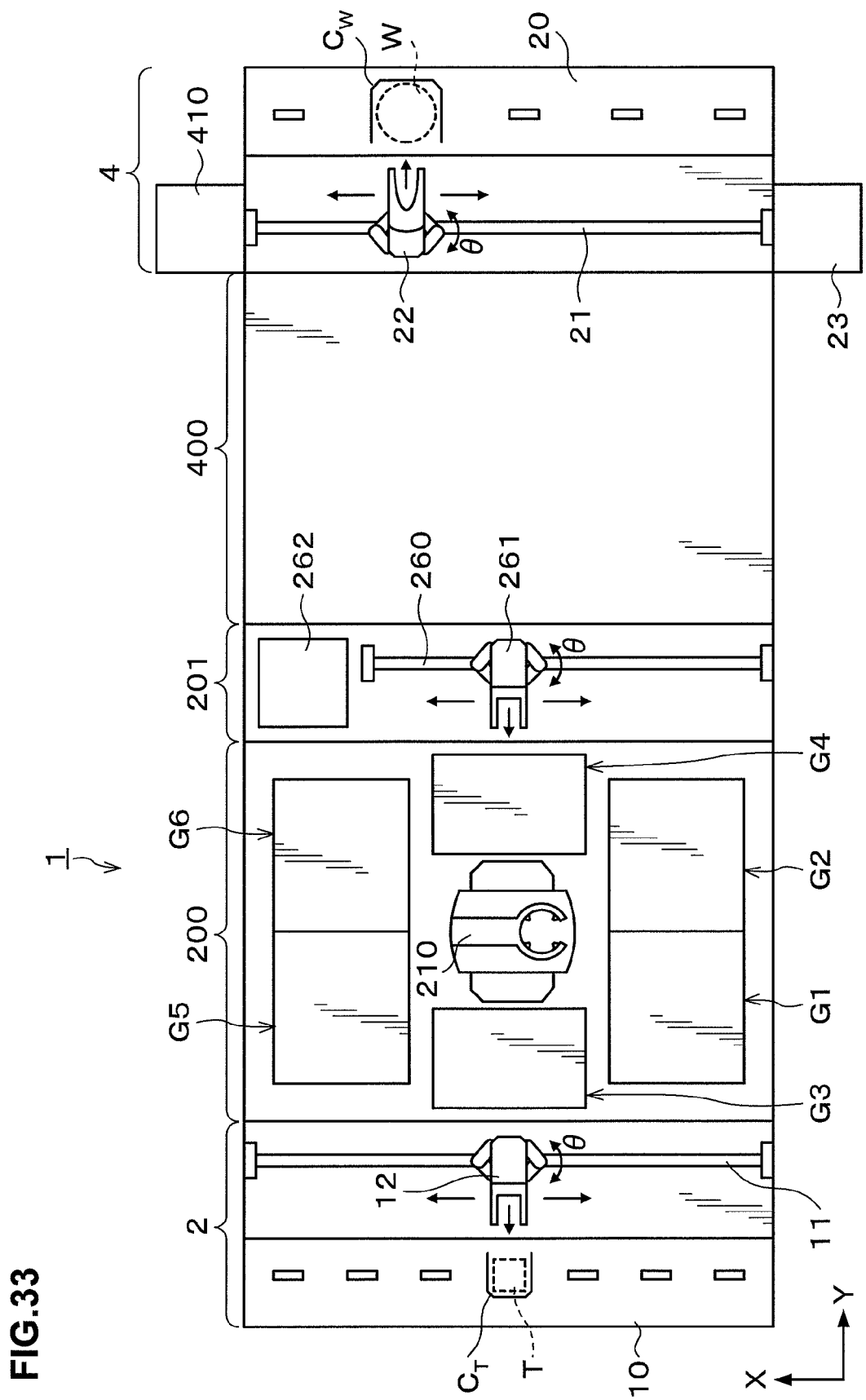
FIG. 33 A plan view illustrating the outline of the configuration of an imprint system according to another embodiment.

The imprint unit 400 having the above configuration is disposed, for example, in the imprint system 1 as illustrated in FIG. 33 in place of the imprint system 3 illustrated in FIG. 12. In this case, since the wafer W is disposed such that its surface to be processed faces downward in the imprint unit 400, it is necessary to reverse the front and rear surfaces of the wafer W before the wafer W is carried into/out of the imprint unit 400. Therefore, a reversing unit 410 reversing the front and rear surfaces of the wafer W is provided in the wafer carry-in/out station 4 of the imprint system 1. Note that since the template T is disposed such that its front surface $T_1$ faces upward in the imprint unit 400, it is unnecessary to reverse the front and rear surfaces of the template T and the reversing unit 13 illustrated in FIG. 12 can be omitted.

Figure 34:
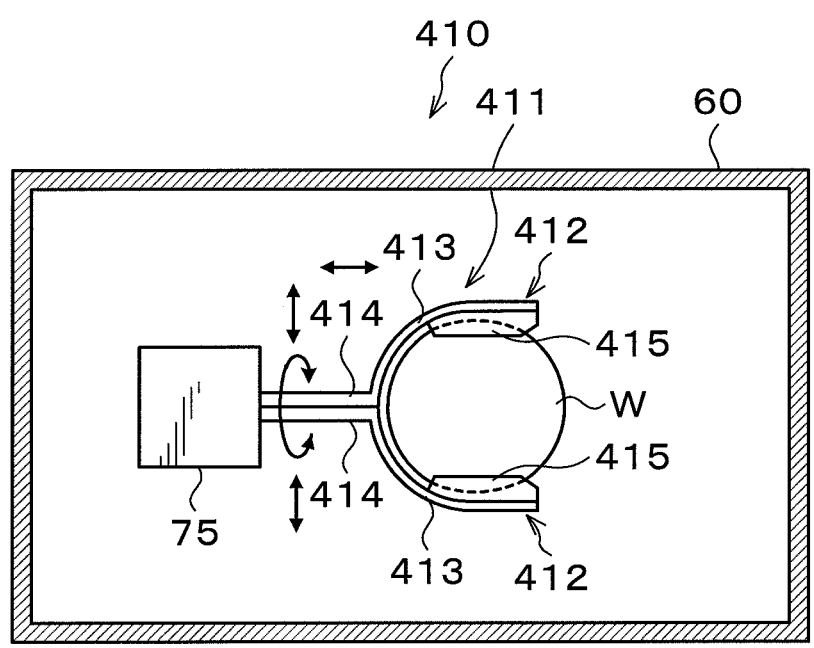
FIG. 34 A transverse sectional view illustrating the outline of the configuration of a reversing unit according to another embodiment.

The reversing unit 410 has a reversing mechanism 411 as illustrated in FIG. 34. The reversing mechanism 411 has a configuration that the pair of holding parts 71, 71 in the reversing mechanism 70 illustrated in FIG. 7 and FIG. 9 are replaced with another pair of holding parts 412, 412. The holding part 412 has a frame part 413 configured in an almost ¾ circular ring shape and an arm part 414 supporting the frame part 413, and the frame part 413 and the arm part 414 are integrally formed. In the frame part 413, a fastening part 415 for holding the wafer W is provided, and a tapered groove (not illustrated) is formed in the fastening part 415. The edge portion of the wafer W is inserted into the tapered grooves of the fastening parts 415 so that the wafer W is supported. Note that the other configuration of the reversing unit 410 is the same as that of the reversing unit 13 illustrated in FIG. 7 and FIG. 9, and therefore the description thereof will be omitted.

In this imprint system 1, Steps B1 to B12 are performed as in the above embodiment. Then, the template T can be successively replaced and predetermined resist patterns P can be successively formed on a plurality of wafers W. Note that the front and rear surfaces of the wafer W are reversed before the wafer W is carried into the imprint unit 400 and after the wafer W is carried out of the imprint unit 400 as described above in this embodiment. Further, the front and rear surfaces of the template T are not reversed, and the template T is processed with the front surface $T_1$ facing upward at all times.

Further, the operation of applying the resist solution onto the template T performed in the imprint unit 400 in the above embodiment may be performed in the treatment station 200.

Figure 35:
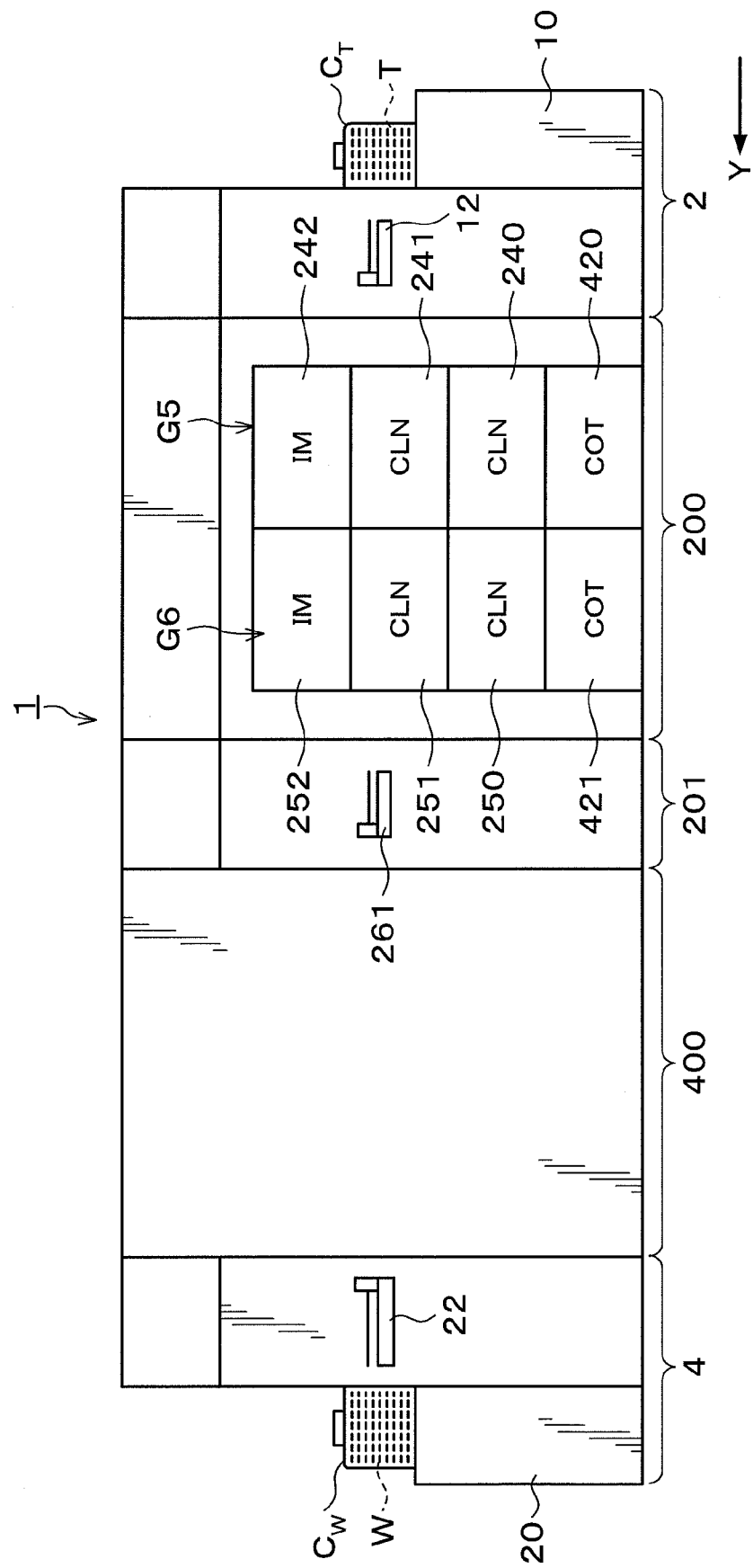
FIG. 35 A side view illustrating the outline of the configuration of an imprint system according to another embodiment.

As illustrated, for example, in FIG. 35, resist coating units 420, 421 as the coating units each applying the resist solution onto the template T are arranged at the lowermost tiers of the fifth treatment block G5 and the sixth treatment block G6. The resist coating unit 420, 421 has a configuration in which the release agent nozzle 302 in the release agent coating unit 211, 213 illustrated in FIG. 18 and FIG. 20 is replaced with a resist solution nozzle supplying the resist solution. Note that in this case, it becomes unnecessary to apply the resist solution onto the template T in the imprint unit 400, so that the resist solution nozzle 42 in the imprint unit 400 can be omitted.

In this case, since the template T on which the resist film R has been formed is carried into the imprint unit 400, after the resist pattern P is formed on one wafer W, the used template T is replaced. This reduces the number of treatment steps in the imprint unit 400, thus making it possible to rapidly form the resist pattern P on the wafer W.

Note that the resist coating units 420, 421 can be arranged also in the imprint system 1 having the imprint unit 3 illustrated in FIG. 12. Also in this case, the resist solution nozzle 42 in the imprint unit 3 can be omitted.

Figure 36:
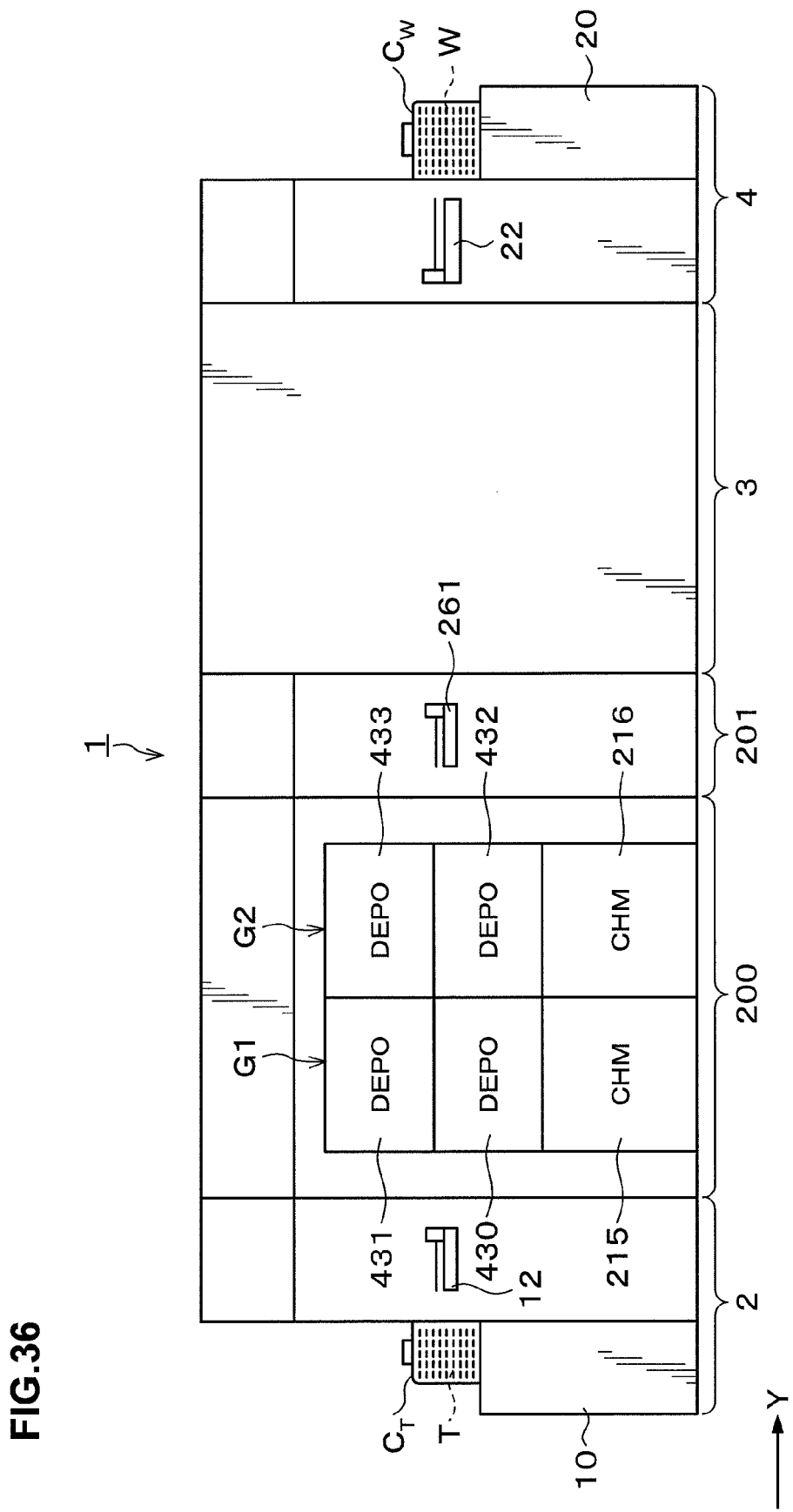
FIG. 36 A side view illustrating the outline of the configuration of the imprint system according to another embodiment.

Though the release agent S is applied to the front surface $T_1$ of the template T by supplying the liquid release agent S onto the rotating template T in the release agent coating unit 211, 213 of the treatment station 200 in the above embodiment, a film of the release agent S may be formed by depositing the vaporized release agent on the front surface $T_1$ of the template T. In this case, release agent coating units 430, 431 are arranged in the first treatment block G1 of the imprint system 1 as illustrated in FIG. 36 in place of the release agent coating unit 211 and the rinse unit 212 illustrated in FIG. 13. Similarly, release agent coating units 432, 433 are arranged also in the second treatment block G2 in place of the release agent coating unit 213 and the rinse unit 214.

Figure 37:
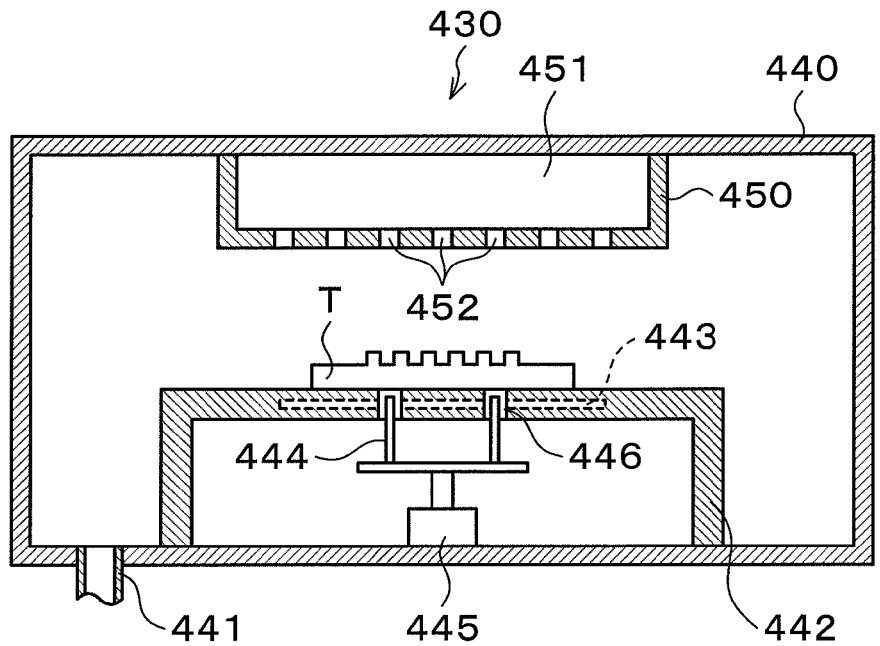
FIG. 37 A longitudinal sectional view illustrating the outline of the configuration of a release agent coating unit according to another embodiment.

The release agent coating unit 430 has a casing 440 having a carry-in/out port (not illustrated) for the template T formed in its side surface as illustrated in FIG. 37. To the bottom surface of the casing 440, an exhaust pipe 441 exhausting the atmosphere in the casing 440 is connected.

On the bottom surface in the casing 440, a mounting table 442 on which the template T is mounted is provided. The template T is mounted on the upper surface of the mounting table 442 such that its front surface $T_1$ faces upward. Inside the upper surface of the mounting table 442, a temperature control plate 443 controlling the temperature of the template T is provided. The temperature control plate 443 has, for example, a Peltier element built therein and can set the template T to a predetermined temperature. In the mounting table 442, raising and lowering pins 444 for supporting the template T from below and raising and lowering the template T are provided. The raising and lowering pins 444 can move up and down by means of a raising and lowering drive part 445. In the upper surface of the mounting table 442, through holes 446 penetrating the upper surface in the thickness direction are formed so that the raising and lowering pins 444 are inserted into the through holes 446.

On the ceiling surface in the casing 440 and above the mounting table 442, a shower head 450 supplying the vaporized release agent downward onto the template T is provided. The shower head 450 is disposed to face the front surface $T_1$ of the template T mounted on the mounting table 442. Inside the shower head 450, an inner space 451 into which the vaporized release agent supplied from a release agent supply source (not illustrated) is introduced is formed. At the lower surface of the shower head 450, a plurality of supply ports 452 supplying downward the release agent introduced into the inner space 451 are provided, distributed over the entire lower surface of the shower head 450. In short, the plurality of supply ports 452 are formed so that the vaporized release agent is supplied uniform within the horizontal surface from the shower head 450. The release agent supplied from the shower head 450 is deposited on the front surface $T_1$ of the template T along the transfer pattern C.

Note that the configurations of the release agent coating units 431, 432, 433 are the same as that of the above-described release agent coating unit 430, and therefore the description thereof will be omitted.

Next, a method of forming a film of the release agent S on the template T in the treatment station 200 in which the release agent coating units 430, 431, 432, 433 are arranged will be described.

Figure 38:
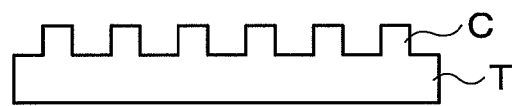
FIG. 38 An explanatory view schematically illustrating the states of a template in respective steps of processing of forming a film of the release agent on the template, (a) of FIG. 38 illustrating the appearance that the front surface of the template is cleaned, (b) of FIG. 38 illustrating the appearance that a vaporized release agent is deposited on the front surface of the template, and (c) of FIG. 38 illustrating the appearance that the release agent on the template is baked.
Figure 38:
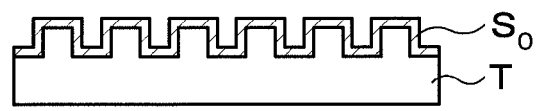
Figure 38:
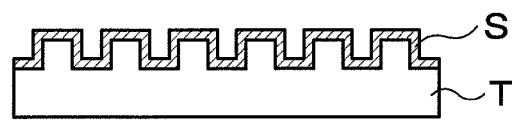

In the treatment station 200, the template T is first carried to the pre-cleaning unit 220, in which the front surface $T_1$ of the template T is cleaned as illustrated in FIG. 38(a). Thereafter, the template T is carried to the release agent coating unit 430, in which a vaporized release agent $S_0$ is supplied onto the front surface $T_1$ of the template T as illustrated in FIG. 38(b) and the release agent $S_0$ is deposited along the transfer pattern C. In this event, the template T is set to a predetermined temperature by the temperature control plate 443. Thereafter, the template T is carried into the heating unit 224, in which the release agent S on the template T is baked as illustrate in FIG. 38(c). The template T is then carried to the temperature regulation unit 221, in which the template T is regulated to a predetermined temperature. In this manner, a film of the release agent S along the transfer pattern C is formed on the front surface $T_1$ of the template T.

According to the above embodiment, since the vaporized release agent $S_0$ is deposited along the transfer pattern C of the template T, it is unnecessary to rinse the release agent S away. Accordingly, it is possible to more smoothly form a film of the release agent S on the template T in the treatment station 200 and thereby improve the throughput of the imprint processing in the imprint system 1.

Though the reversing unit 13 for the template T and the reversing unit 410 for the wafer W are provided outside the imprint units 3, 400 respectively in the above embodiments, mechanisms of reversing the front and rear surfaces of the template T and the wafer W may be provided inside the imprint units 3, 400.

Figure 39:
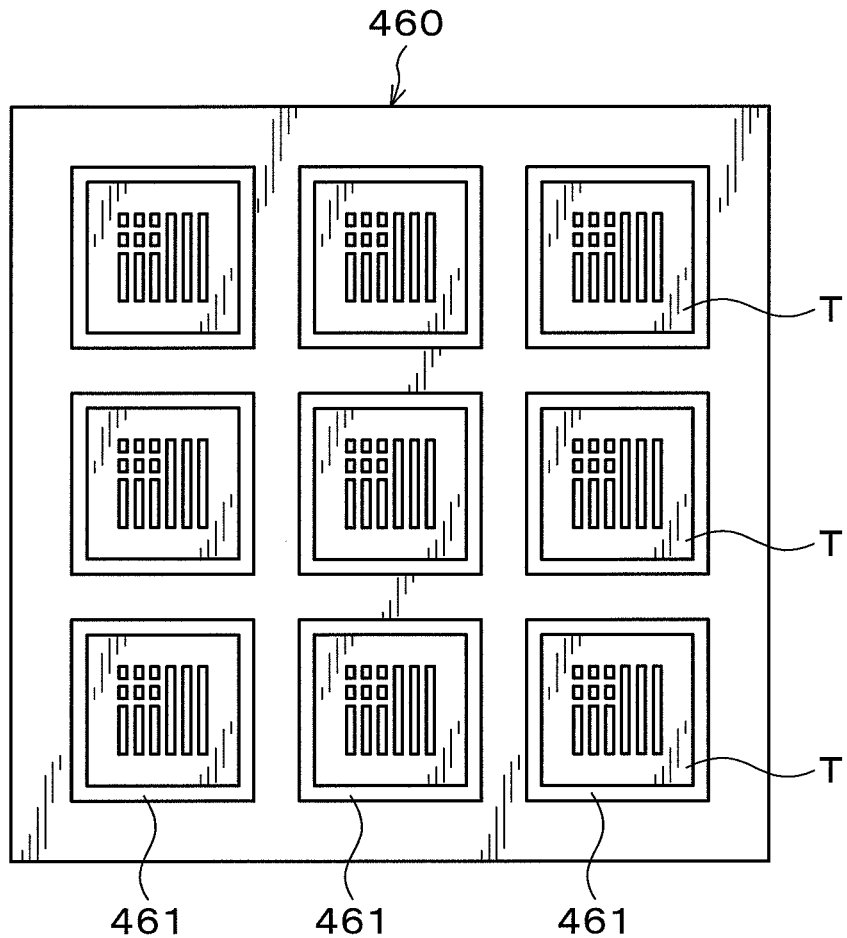
FIG. 39 A plan view of a holder.
Figure 40:
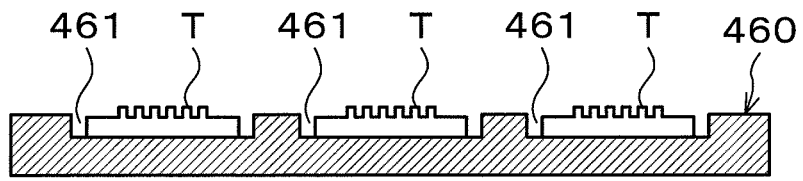
FIG. 40 A longitudinal sectional view of the holder.

Though the template T is individually carried and treated in the template carry-in/out station 2 and the treatment station 200 in the above embodiment, a plurality of, for example, nine templates T may be held by one holder 460 and treated as illustrated in FIG. 39. In this case, accommodating parts 461 recessed downward for accommodating the templates T are provided in the holder 460 as illustrated in FIG. 40. At the bottom surfaces of the accommodating parts 461, for example, a plurality of suction ports (not illustrated) are formed to suction-hold the templates T in the accommodating parts 461.

According to this embodiment, a plurality of templates T held by the holder 460 can be carried at a time to the imprint unit 3 side. Further, it is possible to perform a predetermined treatment on the plurality of templates T at a time in the treatment station 200. Therefore, it is possible to more efficiently replace the template T in the imprint unit 3.

Preferred embodiments of the present invention have been described above with reference to the accompanying drawings, but the present invention is not limited to the embodiments. It should be understood that various changes and modifications are readily apparent to those skilled in the art within the scope of the technical spirit as set forth in claims, and those should also be covered by the technical scope of the present invention. The present invention is not limited to the embodiments but can take various forms. The present invention is also applicable to the case where the substrate is a substrate other than the wafer, such as an FPD (Flat Panel Display), a mask reticle for a photomask or the like.

[Industrial Applicability]

The present invention is useful in transferring a transfer pattern to a coating film formed on a substrate using a template having the transfer pattern formed on a front surface thereof to form a predetermined pattern in the coating film.

[Explanation Of Codes]

1 imprint system
2 template carry-in/out station
3 imprint unit
4 wafer carry-in/out station
13 reversing unit
31 wafer holding part
42 resist solution nozzle
50 template holding part
52 moving mechanism
100 control unit
200 treatment station
201 interface station
211, 213 release agent coating unit
240, 241, 250, 251 post-cleaning unit
242, 252 inspection unit
362 cleaning solution nozzle
365 ultraviolet irradiation part
410 reversing unit
420, 421 resist coating unit
460 holder
C transfer pattern
G1 to G6 treatment block
P resist pattern
R resist film
S release agent
T template
W wafer

What is claimed is:

1. An imprint system comprising an imprint unit transferring a transfer pattern to a coating film formed on a substrate using a template having the transfer pattern formed on a front surface thereof to form a predetermined pattern in the coating film, said imprint system comprising:
a substrate carry-in/out station connected to said imprint unit, capable of keeping a plurality of the substrates, and carrying the substrate into/out of a side of said imprint unit-side; and
a template carry-in/out station connected to said imprint unit, capable of keeping a plurality of the templates, and carrying the template into/out of the side of said imprint unit at a predetermined timing,
wherein a template cleaning block cleaning a front surface of a template carried out of said imprint unit is disposed between said imprint unit and said template carry-in/out station,
wherein said template cleaning block has an ultraviolet irradiation part irradiating the front surface of the template with ultraviolet light,
wherein said template cleaning block has a cleaning solution supply part that is movable toward the template, and the cleaning solution supply part that is moved toward the template supplies a cleaning solution to the front surface of the template supplies a cleaning solution to the front surface of the template and said template cleaning block includes a casing enclosing both the ultraviolet irradiation part and cleaning solution supply part,
wherein said imprint system includes a plurality of stations disposed in a straight line extending from the template carry-in/out station on a first end of said straight line to the substrate carry-in/out station on a second end of said straight line,
wherein said template cleaning block and said imprint unit are located in said straight line between the template carry-in/out station and the substrate carry-in/out station.

2. The imprint system as set forth in claim 1, wherein a release agent treatment block forming a film of a release agent on the template is disposed between said imprint unit and said template carry-in/out station.

3. The imprint system as set forth in claim 1, wherein the cleaning solution is an organic solvent.

4. The imprint system as set forth in claim 1, wherein the cleaning solution is pure water.

5. The imprint system as set forth in claim 1, wherein said template cleaning block has an inspection unit inspecting the front surface of the template after the cleaning.

6. The imprint system as set forth in claim 1, wherein said imprint unit comprises:
a substrate holding part holding the substrate;
a template holding part holding the template; and
a moving mechanism moving said template holding part up and down, and
wherein said substrate holding part and said template holding part are arranged such that the substrate held by said substrate holding part and the template held by said template holding part face each other.

7. The imprint system as set forth in claim 6, wherein said template holding part is disposed above said substrate holding part in said imprint unit, and
wherein a reversing unit reversing front and rear surfaces of the template is provided on a side of said template carry-in/out station with respect to said imprint unit.

8. The imprint system as set forth in claim 7, wherein said imprint unit comprises a coating solution supply part supplying a coating solution onto the substrate held by said substrate holding part, to form the coating film.

9. The imprint system as set forth in claim 6, wherein said template holding part is disposed below said substrate holding part in said imprint unit, and
wherein a reversing unit reversing front and rear surfaces of the substrate is provided on a side of said substrate carry-in/out station with respect to said imprint unit.

10. The imprint system as set forth in claim 9, wherein said imprint unit comprises a coating solution supply part supplying a coating solution onto the template held by said template holding part, to form the coating film.

11. The imprint system as set forth in claim 7, wherein a coating unit applying a coating solution onto the template is disposed between said imprint unit and said template carry-in/out station, to form the coating film.

12. The imprint system as set forth in claim 2, wherein a plurality of the templates are held by one holder at least between said imprint unit and said template carry-in/out station.

* * * * *